(12) United States Patent
Chen

(10) Patent No.: US 12,108,603 B2
(45) Date of Patent: Oct. 1, 2024

(54) METHODS FOR FORMING ON-CHIP CAPACITOR STRUCTURES IN SEMICONDUCTOR DEVICES

(71) Applicant: YANGTZE MEMORY TECHNOLOGIES CO., LTD., Wuhan (CN)

(72) Inventor: Liang Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 985 days.

(21) Appl. No.: 17/038,406

(22) Filed: Sep. 30, 2020

(65) Prior Publication Data

US 2022/0068947 A1    Mar. 3, 2022

Related U.S. Application Data

(63) Continuation of application No. PCT/CN2020/112962, filed on Sep. 2, 2020.

(51) Int. Cl.
*H01L 27/11573*    (2017.01)
*G11C 16/06*    (2006.01)
(Continued)

(52) U.S. Cl.
CPC .............. *H10B 43/40* (2023.02); *G11C 16/06* (2013.01); *H01L 21/76816* (2013.01);
(Continued)

(58) Field of Classification Search
CPC ...................................................... H10B 43/40
See application file for complete search history.

(56) References Cited

U.S. PATENT DOCUMENTS 10,403,631 B1    9/2019  Lu et al.
2008/0268606 A1  10/2008  Uchiyama
(Continued)

FOREIGN PATENT DOCUMENTS

CN    101587891 A    11/2009
CN    104269375 A    1/2015
(Continued)

OTHER PUBLICATIONS

International Search Report issued in corresponding International Application No. PCT/CN2020/112962, mailed Apr. 27, 2021, 5 pages.

(Continued)

*Primary Examiner* — Peter Bradford
(74) *Attorney, Agent, or Firm* — BAYES PLLC

(57) ABSTRACT

Embodiments of semiconductor devices and methods for forming the same are disclosed. In an example, a method for forming a semiconductor device is disclosed. A first interlayer dielectric (ILD) layer is formed on a first side of a substrate. A plurality of first contacts each extending vertically through the first ILD layer and in contact with the substrate are formed. The substrate is thinned from a second side opposite to the first side of the substrate. A plurality of dielectric cuts each extending vertically through the thinned substrate are formed to separate the thinned substrate into a plurality of semiconductor blocks, such that the plurality of semiconductor blocks are in contact with the plurality of first contacts, respectively.

20 Claims, 15 Drawing Sheets

(51) Int. Cl.
H01L 21/768 (2006.01)
H01L 23/522 (2006.01)
H01L 49/02 (2006.01)
H10B 43/10 (2023.01)
H10B 43/27 (2023.01)
H10B 43/40 (2023.01)

(52) U.S. Cl.
CPC .... *H01L 21/76895* (2013.01); *H01L 23/5223* (2013.01); *H01L 23/5226* (2013.01); *H01L 28/40* (2013.01); *H10B 43/10* (2023.02); *H10B 43/27* (2023.02)

(56) References Cited

U.S. PATENT DOCUMENTS

| | | |
|---|---|---|
| 2013/0270674 A1 | 10/2013 | Darabi et al. |
| 2014/0197499 A1 | 7/2014 | Chen et al. |
| 2015/0318296 A1 | 11/2015 | Kim et al. |
| 2016/0049192 A1 | 2/2016 | Lee |
| 2018/0090486 A1 | 3/2018 | Cheng et al. |
| 2019/0081069 A1 | 3/2019 | Lu et al. |
| 2019/0333983 A1 | 10/2019 | Rubin et al. |
| 2020/0265886 A1* | 8/2020 | Chen ................ G11C 11/404 |
| 2021/0320094 A1* | 10/2021 | Zhang ................ H01L 25/50 |
| 2022/0068946 A1* | 3/2022 | Chen ................ H10B 41/27 |

FOREIGN PATENT DOCUMENTS

| | | | | |
|---|---|---|---|---|
| CN | 108028223 A | 5/2018 | | |
| CN | 110036475 A | 7/2019 | | |
| CN | 110121779 A | 8/2019 | | |
| CN | 110164867 A | 8/2019 | | |
| CN | 110574163 A | 12/2019 | | |
| CN | 110622305 A | 12/2019 | | |
| CN | 110914987 A | 3/2020 | | |
| CN | 111354711 A | 6/2020 | | |
| CN | 111370423 A | 7/2020 | | |
| CN | 111566815 A | 8/2020 | | |
| CN | 111566816 A | 8/2020 | | |
| CN | 112166501 A | * | 1/2021 | ........... H01L 23/481 |
| CN | 110622305 B | * | 3/2021 | ............. G11C 11/24 |
| CN | 113039643 A | * | 6/2021 | ....... H01L 21/76832 |
| KR | 20150126216 A | 11/2015 | | |
| TW | 202032740 A | 9/2020 | | |
| TW | 202032801 A | 9/2020 | | |
| WO | WO-2020168453 A1 | * | 8/2020 | ............. G11C 11/24 |

OTHER PUBLICATIONS

International Search Report issued in corresponding International Application No. PCT/CN2020/112959, mailed May 31, 2021, 4 pages.

* cited by examiner

METHODS FOR FORMING ON-CHIP CAPACITOR STRUCTURES IN SEMICONDUCTOR DEVICES

CROSS-REFERENCE TO RELATED APPLICATIONS

This application is a continuation of International Application No. PCT/CN2020/112962, filed on Sep. 2, 2020, entitled "METHODS FOR FORMING ON-CHIP CAPACITOR STRUCTURES IN SEMICONDUCTOR DEVICES," which is hereby incorporated by reference in its entirety. This application is also related to U.S. application Ser. No. 17/038,385, filed on Sep. 30, 2020, entitled "ON-CHIP CAPACITOR STRUCTURES IN SEMICONDUCTOR DEVICES," which is hereby incorporated by reference in its entirety.

BACKGROUND

Embodiments of the present disclosure relate to semiconductor devices and fabrication methods thereof.

Integrate circuits technology allow creating many types of devices on the silicon die. The most common devices are transistors, diodes, resistors, or capacitors. Capacitors are elements that are used in semiconductor devices for storing an electrical charge. Capacitors include two conductive plates separated by an insulating material. Capacitors are used in applications such as electronic filters, analog-to-digital converters, memory devices, control applications, and many other types of semiconductor device applications.

Various types of capacitor designs have been used in integrating on-chip capacitors to reduce the die-area occupied by the capacitors and increase the capacitance density, including, for example, metal-insulator-metal (MIM) capacitors, metal-oxide-metal (MOM) capacitors, metal-oxide-semiconductor (MOS) capacitors, metal fringe capacitors, trench capacitors, and junction capacitors, to name a few.

SUMMARY

Embodiments of semiconductor devices and methods for forming the same are disclosed herein.

In one example, a method for forming a semiconductor device is disclosed. A first interlayer dielectric (ILD) layer is formed on a first side of a substrate. A plurality of first contacts each extending vertically through the first ILD layer and in contact with the substrate are formed. The substrate is thinned from a second side opposite to the first side of the substrate. A plurality of dielectric cuts each extending vertically through the thinned substrate are formed to separate the thinned substrate into a plurality of semiconductor blocks, such that the plurality of semiconductor blocks are in contact with the plurality of first contacts, respectively.

In another example, a method for forming a semiconductor device is disclosed. A first ILD layer is formed on a first side of a substrate. A plurality of first contacts each extending vertically through the first ILD layer and in contact with the substrate are formed. The substrate is thinned from a second side opposite to the first side of the substrate. A second ILD layer is formed on the second side of the thinned substrate. A plurality of second contacts each extending vertically through the second ILD layer and the thinned substrate and in contact with the plurality of first contacts, respectively, are formed.

In still another example, a method for operating a 3D semiconductor device including a stack of a first ILD layer, a semiconductor layer, and a second ILD layer, and a capacitor structure is disclosed. A first capacitor and at least one of a second capacitor or a third capacitor are simultaneously charged. The first capacitor is charged by applying a voltage on a pair of first contacts each extending vertically through the first ILD layer. The second capacitor is charged by applying the voltage on a pair of portions of the semiconductor layer separated by a dielectric cut extending vertically through the semiconductor layer. A third capacitor is charged by applying the voltage on a pair of second contacts each extending vertically through the second ILD layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
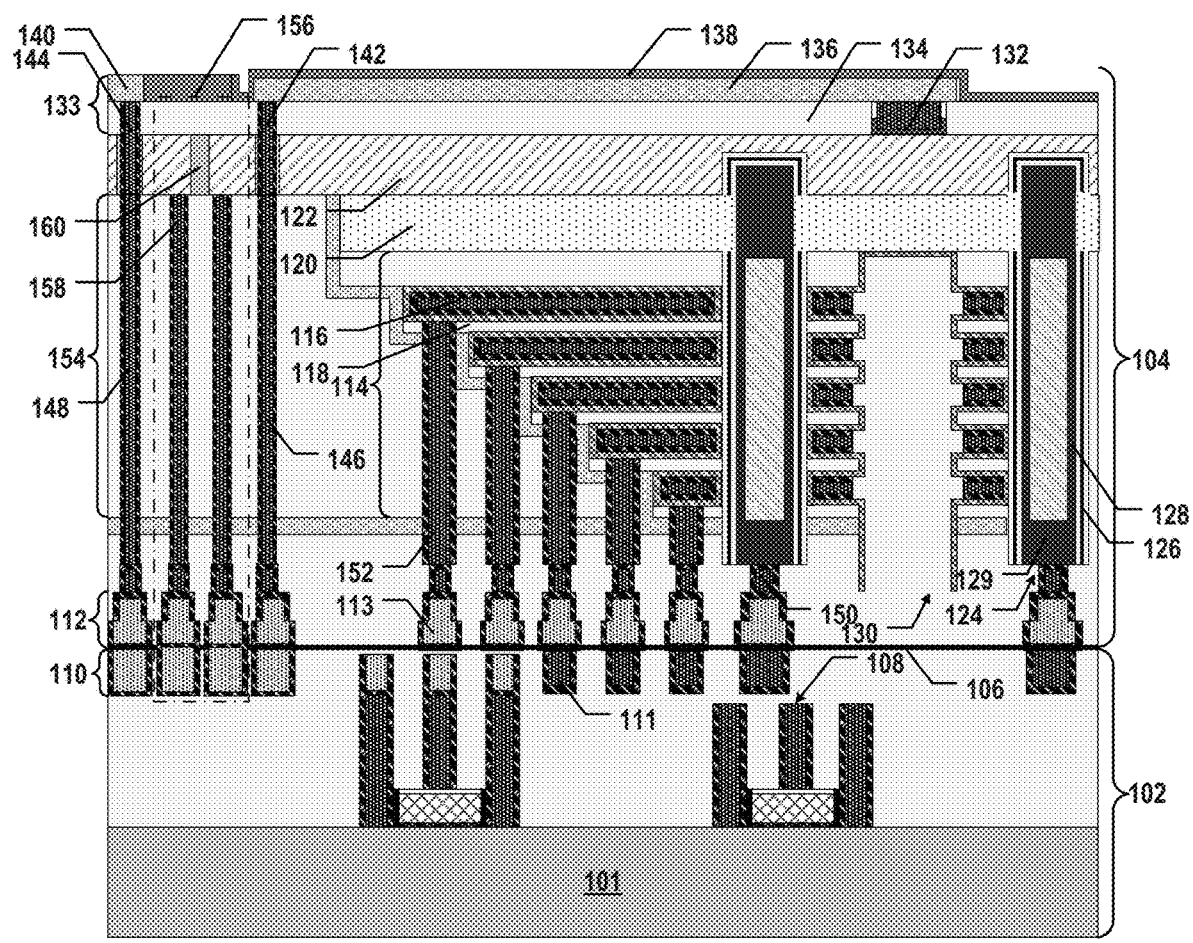
FIG. 1 illustrates a side view of a cross-section of an exemplary 3D memory device having on-chip capacitors, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means "above" or "over" something but can also include the meaning that it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region, of a homogeneous or inhomogeneous continuous structure, that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter, for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some semiconductor devices, such as NAND Flash memory devices, on-chip capacitors are formed in the peripheral circuits. As capacitors are the bulkiest devices in the peripheral circuits, the conventional designs of on-chip capacitors limit the shrinkage of the die area of the perioral circuits as well as the flexibility of the metal routing. In particular, for some 3D semiconductor devices in which multiple chips are stacked, the large area of on-chip capacitors even on one chip can limit the shrinkage of the entire device size.

Various embodiments in accordance with the present disclosure provide various novel designs of on-chip capacitor structures in 3D semiconductor devices. By utilizing an ILD layer with large thickness as the capacitor dielectric, the capacitor structure can extend vertically to reduce its planar size. In some embodiments, the semiconductor layer (e.g., the thinned substrate) on which the ILD layer is formed and dielectric cuts therethrough are also used as part of the capacitor structure to further increase the capacitance density. In some embodiments, another ILD layer, which is part of the backside interconnect structure, is further integrated into the on-chip capacitor structure on the opposite side of the thinned substrate. The on-chip capacitor structures can be used in the memory array chip of a 3D NAND Flash memory device, which already has a thick ILD layer outside of the memory stack and has its thickness continuously increasing as the level of memory stack increases. As a result, the capacitance density of the on-chip capacitor structures can be increased without increasing the planar die size, and the metal routing of the semiconductor devices can be simplified as well.

FIG. 1 illustrates a side view of a cross-section of an exemplary 3D memory device 100 having on-chip capacitors, according to some embodiments of the present disclosure. 3D memory device 100 may be one example of a semiconductor device having on-chip capacitors disclosed herein. In some embodiments, 3D memory device 100 is a bonded chip including a first semiconductor structure 102 and a second semiconductor structure 104 stacked over first semiconductor structure 102. First and second semiconductor structures 102 and 104 are joined at a bonding interface 106 therebetween, according to some embodiments. As shown in FIG. 1, first semiconductor structure 102 can include a substrate 101, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 102 of 3D memory device 100 can include peripheral circuits 108 on substrate 101. It is noted that x-, y-, and z-axes are included in FIG. 1 to illustrate the spatial relationships of the components in 3D memory device 100. Substrate 101 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, peripheral circuit 108 is configured to control and sense the 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, peripheral circuit 108 may further include any other circuits compatible with the advanced logic processes including logic circuits, such as processors and programmable logic devices (PLDs) or memory circuits, such as static random-access memory (SRAM). For example, the devices of first semiconductor structure 102 may be formed using complementary metal-oxide-semiconductor (CMOS) compatible processes and thus, may be referred to herein as a "CMOS chip."

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 1, second semiconductor structure 104 of 3D memory device 100 can include an array of channel structures 124 functioning as the array of NAND memory strings. For example, second semiconductor structure 104 may be referred to herein as a "memory array chip." As shown in FIG. 1, each channel structure 124 can extend vertically through a plurality of pairs each including a conductive layer 116 and a dielectric layer 118. The interleaved conductive layers 116 and dielectric layers 118 are part of a memory stack 114. The number of the pairs of conductive layers 116 and dielectric layers 118 in memory stack 114 (e.g., 32, 64, 96, 128, 160, 192, 224, 256, or more) determines the number of memory cells in 3D memory device 100. It is understood that in some embodiments, memory stack 114 may have a multi-deck architecture (not shown), which includes a plurality of memory decks stacked over one another. The numbers of the pairs of conductive layers 116 and dielectric layers 118 in each memory deck can be the same or different.

Memory stack 114 can include a plurality of interleaved conductive layers 116 and dielectric layers 118. Conductive layers 116 and dielectric layers 118 in memory stack 114 can alternate in the vertical direction. In other words, except the ones at the top or bottom of memory stack 114, each conductive layer 116 can be adjoined by two dielectric layers 118 on both sides, and each dielectric layer 118 can be adjoined by two conductive layers 116 on both sides. Conductive layers 116 can include conductive materials including, but not limited to, W, Co, Cu, Al, polysilicon, doped silicon, silicides, or any combination thereof. Each conductive layer 116 can include a gate electrode (gate line) surrounded by an adhesive layer and a gate dielectric layer. The gate electrode of conductive layer 116 can extend laterally as a word line, ending at one or more staircase structures of memory stack 114. Dielectric layers 118 can include dielectric materials including, but not limited to, silicon oxide, silicon nitride, silicon oxynitride, or any combination thereof.

As shown in FIG. 1, second semiconductor structure 104 of 3D memory device 100 can also include a first semiconductor layer 120 above memory stack 114 and a second semiconductor layer 122 above and in contact with first semiconductor layer 120. In some embodiments, each of first and second semiconductor layers 120 and 122 is an N-type doped semiconductor layer, e.g., a silicon layer doped with N-type dopant(s), such as phosphorus (P) or arsenic (As). In some embodiments, first semiconductor layer 120 can be formed above a substrate by thin film deposition and/or epitaxial growth. In contrast, second semiconductor layer 122 can be a thinned substrate, for example, including single crystalline silicon.

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. In some embodiments, memory film 126 is a composite layer including a tunneling layer, a storage layer (also known as a "charge trap layer"), and a blocking layer. The remaining space of channel structure 124 can be partially or fully filled with a capping layer including dielectric materials, such as silicon oxide, and/or an air gap. Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some embodiments, channel structure 124 further includes a channel plug 129 in the bottom portion (e.g., at the lower end) of channel structure 124. As used herein, the "upper end" of a component (e.g., channel structure 124) is the end farther away from substrate 101 in the z-direction, and the "lower end" of the component (e.g., channel structure 124) is the end closer to substrate 101 in the z-direction when substrate 101 is positioned in the lowest plane of 3D memory device 100. Channel plug 129 can include semiconductor materials (e.g., polysilicon). In some embodiments, channel plug 129 functions as the drain of the NAND memory string.

As shown in FIG. 1, each channel structure 124 can extend vertically through interleaved conductive layers 116 and dielectric layers 118 of memory stack 114 and first semiconductor layer 120. In some embodiments, first semiconductor layer 120 surrounds part of channel structure 124 and is in contact with semiconductor channel 128 including polysilicon. That is, memory film 126 is disconnected at part of channel structure 124 that abuts first semiconductor layer 120, exposing semiconductor channel 128 to be in contact with the surrounding first semiconductor layer 120, according to some embodiments. In some embodiments, each channel structure 124 can extend vertically further into second semiconductor layer 122, e.g., a thinned substrate. That is, each channel structure 124 extends vertically through memory stack 114. As shown in FIG. 1, the top portion (e.g., the upper end) of channel structures 124 is in second semiconductor layer 122, according to some embodiments.

As shown in FIG. 1, second semiconductor structure 104 of 3D memory device 100 can further include insulating structures 130 each extending vertically through interleaved conductive layers 116 and dielectric layers 118 of memory stack 114. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. In some embodiments, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide.

3D memory device 100 can include a backside source contact 132 above memory stack 114 and in contact with second semiconductor layer 122, as shown in FIG. 1. Source contact 132 and memory stack 114 (and insulating structure 130 therethrough) can be disposed at opposite sides of second semiconductor layer 122 (e.g., a thinned substrate) and thus, viewed as a "backside" source contact. In some embodiments, source contact 132 is electrically connected to first semiconductor layer 120 and semiconductor channel 128 of channel structure 124 through second semiconductor layer 122. In some embodiments in which second semiconductor layer 122 includes an N-well, source contact 132 is also referred to herein as an "N-well pick up." Source contacts 132 can include any suitable types of contacts. In some embodiments, source contacts 132 include a VIA contact. In some embodiments, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

As shown in FIG. 1, 3D memory device 100 can further include a BEOL interconnect layer 133 above and in contact with source contact 132 for pad-out, e.g., transferring electrical signals between 3D memory device 100 and external circuits. In some embodiments, interconnect layer 133 includes an ILD layer 134 on second semiconductor layer 122 and a redistribution layer 136 on ILD layer 134. The upper end of source contact 132 is flush with the top surface of ILD layer 134 and the bottom surface of redistribution layer 136, and source contact 132 extends vertically through ILD layer 134 to be in contact with second semiconductor layer 122, according to some embodiments. ILD layer 134 in interconnect layer 133 can include dielectric materials including, but not limited to, silicon oxide, silicon nitride, silicon oxynitride, low-k dielectrics, or any combination thereof. It is understood that ILD layer 134 may include multiple sublayers in some examples, such as one or more silicon oxide layers and one or more silicon nitride layers. Redistribution layer 136 in interconnect layer 133 can include conductive materials including, but not limited to W, Co, Cu, Al, silicides, or any combination thereof. In one example, redistribution layer 136 includes Al. In some embodiments, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer.

In some embodiments, second semiconductor structure 104 of 3D memory device 100 further includes contacts 142 and 144 through second semiconductor layer 122. As second semiconductor layer 122 can be a thinned substrate, contacts 142 and 144 are through substrate contacts (TSCs), according to some embodiments. In some embodiments, contact 142 extends through second semiconductor layer 122 and ILD layer 134 to be in contact with redistribution layer 136, such that first semiconductor layer 120 is electrically connected to contact 142 through second semiconductor layer 122, source contact 132, and redistribution layer 136 of interconnect layer 133. In some embodiments, contact 144 extends through second semiconductor layer 122 and ILD layer 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some embodiments, at least contact 144 further includes a spacer (e.g., a dielectric layer) to electrically insulate contact 144 from second semiconductor layer 122.

In some embodiments, 3D memory device 100 further includes peripheral contacts 146 and 148 each extending vertically through an ILD layer 154 to second semiconductor layer 122 (e.g., an N-well of a P-type silicon substrate) outside of memory stack 114. ILD layer 154 can have the thickness equal to or greater than the thickness of memory stack 114. Each peripheral contact 146 or 148 can have a depth equal to or greater than the thickness of memory stack 114 to extend vertically from bonding layer 112 to second semiconductor layer 122 in a peripheral region that is outside of memory stack 114. In some embodiments, peripheral contact 146 is below and in contact with contact 142, such that first semiconductor layer 120 is electrically connected to peripheral circuit 108 in first semiconductor structure 102 through at least second semiconductor layer 122, source contact 132, interconnect layer 133, contact 142, and peripheral contact 146. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1, 3D memory device 100 also includes a variety of local contacts (also known as "C1 contacts") as part of the interconnect structure, which are in contact with a structure in memory stack 114 directly. In some embodiments, the local contacts include channel local contacts 150 each below and in contact with the lower end of a respective channel structure 124. Each channel local contact 150 can be electrically connected to a bit line contact (not shown) for bit line fan-out. In some embodiments, the local contacts further include word line local contacts 152 each below and in contact with a respective conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

As shown in FIG. 1, by utilizing ILD layer 154 having the thickness equal to or greater than memory stack 114, second semiconductor structure 104 (e.g., the memory array chip) of 3D memory device 100 can include a capacitor structure 156 in the peripheral region outside of memory stack with a relatively large capacitance density and a relatively small planar size. Similar to ILD layer 134, ILD layer 154 can include dielectric materials including, but not limited to, silicon oxide, silicon nitride, silicon oxynitride, low-k dielectrics, or any combination thereof. It is understood that ILD layer 154 may include multiple sublayers in some examples, such as one or more silicon oxide layers and one or more silicon nitride layers. To accommodate the thickness of memory stack 114, the thickness of ILD layer 154 is relatively large, e.g., equal to or greater than the thickness of memory stack 114. ILD layer 154 can be formed on second semiconductor layer 122 (e.g., a thinned substrate) and thus, below and in contact with second semiconductor layer 122 as shown in FIG. 1.

Capacitor structure 156 also includes a pair of peripheral contacts 158 each extending vertically through ILD layer 154 and in contact with second semiconductor layer 122, according to some embodiments. The pair of peripheral contacts 158 thus can act as two electrodes of capacitor structure 156 separated by a capacitor dielectric, i.e., part of ILD layer 154 laterally between the pair of peripheral contacts 158. In some embodiments, the pair of peripheral contacts 158 are a pair of parallel wall-shaped contacts each extending laterally, e.g., in the y-direction in FIG. 1, to further increase the size of the capacitor electrodes and dielectric and the resulting capacitance. Similar to peripheral contacts 146 and 148, peripheral contacts 158 each can include one or more conductive layers, such as a metal layer (e.g., W, Co, Cu, or Al) or a silicide layer surrounded by an adhesive layer (e.g., TiN).

As the pair of peripheral contacts 158 can be in contact with second semiconductor layer 122, which can be doped as an N-well in a thinned silicon substrate, to electrically separate the pair of peripheral contacts 158, a dielectric cut 160 can be formed extending vertically through second semiconductor layer 122 to separate second semiconductor layer 122 into semiconductor blocks insulated from one another. Dielectric cut 160 can include dielectric materials including, but not limited to, silicon oxide, silicon nitride, silicon oxynitride, low-k dielectrics, or any combination thereof. In some embodiments, dielectric cut 160 extends laterally, e.g., in the y-direction in FIG. 1, to cut off second semiconductor layer 122. As a result, as shown in FIG. 1, capacitor structure 156 can further include a pair of semiconductor blocks of second semiconductor layer 122 in contact with the pair of peripheral contacts 158, respectively, and dielectric cut 160 laterally between the pair of semiconductor blocks of second semiconductor layer 122. That is, the pair of semiconductor blocks of second semiconductor layer 122 can also act as two electrodes of capacitor structure 156 separated by a capacitor dielectric, i.e., dielectric cut 160. Thus, capacitor structure 156 can include two capacitors in parallel: a first capacitor formed by the pair of peripheral contacts 158 and the part of ILD layer 154 therebetween, and a second capacitor formed by the pair of semiconductor blocks of second semiconductor layer 122 and dielectric cut 160 therebetween. Although not shown in FIG. 1, as described below in detail, in some examples, ILD layer 134 and the contacts therethrough (e.g., the contacts formed in the same process as source contact 132 and/or TSC contacts 142 and 144) may be configured to form another capacitor as part of capacitor structure 156 as well.

In some embodiments, first semiconductor structure 102 (e.g., the CMOS chip) of 3D memory device 100 does not have on-chip capacitor structures therein to reduce the die size of first semiconductor structure 102. Instead, second semiconductor structure 104 (e.g., the memory array chip) of 3D memory device 100 can have a plurality of capacitor structures 156 electrically connected to peripheral circuits 108 of first semiconductor structure 102 through the interconnect layers and bonding layers 110 and 112 to satisfy the needs of capacitors in peripheral circuits 108 of 3D memory device 100. Because of the naturally thick ILD layer 154 in the memory array chip, the capacitance density of capacitor structure 156 can be increased by extending the capacitor electrodes vertically without increasing the planar area of capacitor structure 156, thereby reducing the overall die size of bonded 3D memory device 100.

Figure 2:
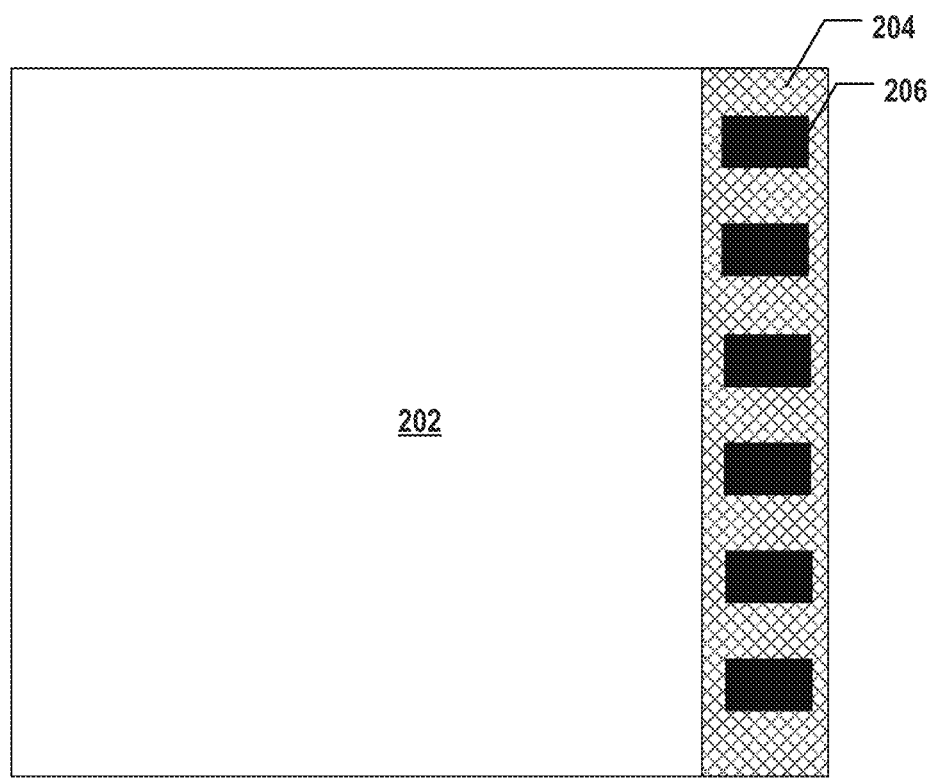
FIG. 2 illustrates a plan view of an exemplary 3D memory device having on-chip capacitors, according to some embodiments of the present disclosure.
Figure 2:
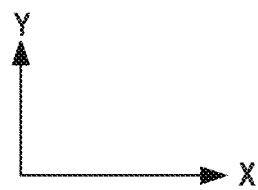

FIG. 2 illustrates a plan view of an exemplary 3D memory device 200 having on-chip capacitors, according to some embodiments of the present disclosure. 3D memory device 200 may be one example of 3D memory device 100 in FIG. 1, and FIG. 2 may illustrate a plan view of the backside of 3D memory device 100 in FIG. 1, according to some embodiments. As shown in FIG. 2, 3D memory device 200 can include a memory array chip, corresponding to second semiconductor structure 104 in 3D memory device 100 in FIG. 1, having a core array region 202 in which the memory stack and channel structures are formed, e.g., corresponding to memory stack 114 and channel structures 124. The memory array chip of 3D memory device 200 can also include one or more peripheral regions 204 outside of core array region 202 in which the memory stack is formed. Peripheral region 204 is at the edge of 3D memory device 200, according to some embodiments. In some embodiments, contact pads 206 are formed in peripheral region 204, corresponding to contact pads 140. The on-chip capacitor structures disclosed herein (e.g., capacitor structure 156 in FIG. 1) can be formed in the remaining area of peripheral region 204 without contact pads 206, which do not require extra space from the memory array chip of 3D memory device 200. The metal routing of 3D memory device 200 can be simplified as well due to the floorplan of the on-chip capacitor structures in peripheral regions 204 outside of core array region 202 as well as the reduced planar sizes of the on-chip capacitor structures.

It is understood although capacitor structure 156 is illustrated in 3D memory device 100 in FIG. 1, the on-chip capacitor structures disclosed herein may be formed in any other suitable semiconductor devices, such as 3D semiconductor devices having a relatively thick ILD layer on a thinned substrate. It is also understood that a 3D memory device in which capacitor structure 156 or any other on-chip capacitor structures disclosed herein is formed is not limited to the example of 3D memory device 100 in FIG. 1 and may have any suitable architectures that include a memory stack and an ILD layer outside of the memory stack and having the thickness equal to or greater than the thickness of the memory stack. It is further understood that the on-chip capacitor structures disclosed herein, such as capacitor structure 156 in FIG. 1, can serve any suitable functions in a semiconductor device, such as decoupling capacitors (also known as bypass capacitors) for decoupling one part of a circuit from another (e.g., to bypass the power supply or other high impedance component of a circuit to keep the voltage stable), coupling capacitors for blocking the DC signal on the transmission line, filter capacitors in electronic filters, etc.

Figure 3:
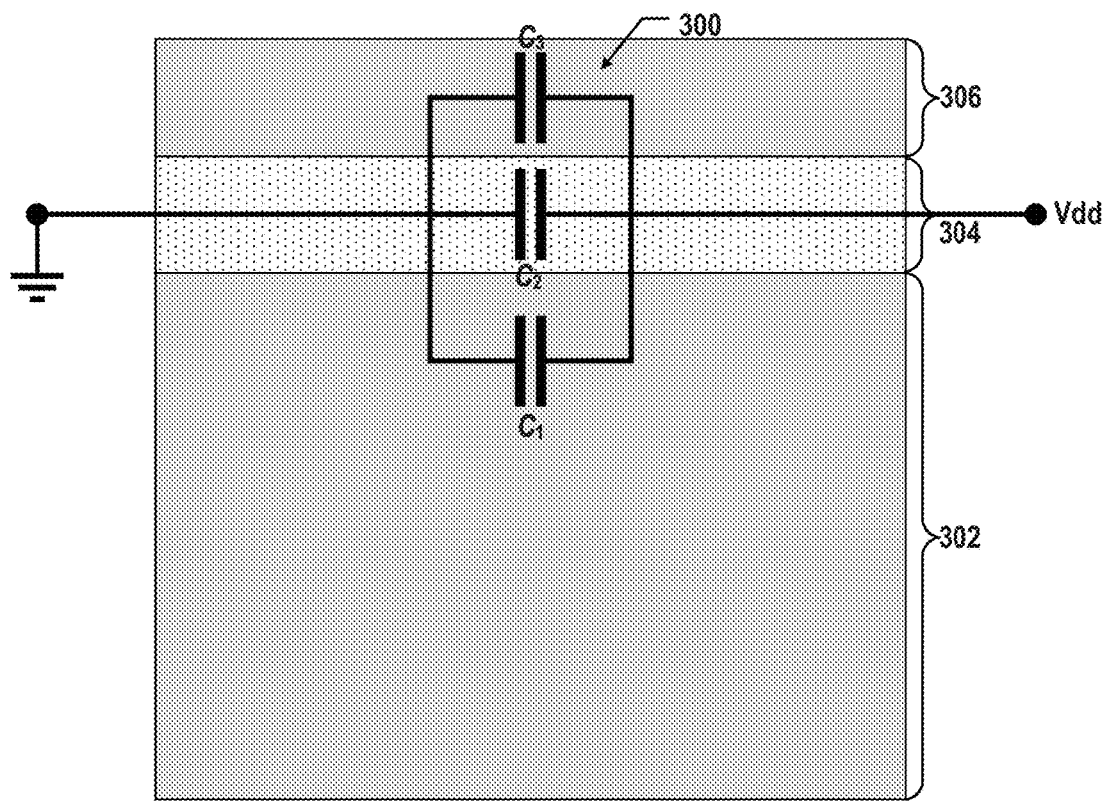
FIG. 3 illustrates a schematic diagram of an on-chip capacitor structure having capacitors in parallel in a 3D semiconductor device, according to some embodiments of the present disclosure.
Figure 3:
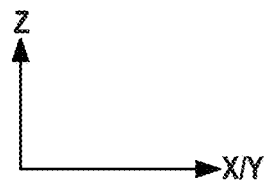

FIG. 3 illustrates a schematic diagram of an on-chip capacitor structure 300 having capacitors in parallel in a 3D semiconductor device, according to some embodiments of the present disclosure. As shown in FIG. 3, the 3D semiconductor device, such as 3D memory device 100, can include a stack of a first ILD layer 302, a semiconductor layer 304, and a second ILD layer 306. First and second ILD layers 302 and 306 can be disposed on opposite sides of semiconductor layer 304 (e.g., a thinned substrate), such as ILD layers 154 and 134 disposed on the front side and backside of second semiconductor layer 122 in FIG. 1. In some embodiments, the thickness of first ILD layer 302 is greater than the thickness of second ILD layer 306. Capacitor structure 300 can include a first capacitor $C_1$ formed based on first ILD layer 302. Capacitor structure 300 can also include a second capacitor $C_2$ formed based on semiconductor layer 304 and/or a third capacitor $C_3$ formed based on second ILD layer 306. First capacitor $C_1$ and at least one of second and third capacitors $C_2$ and $C_3$ are in parallel, such that the total capacitance of capacitor structure 300 is the addition of the capacitance of first capacitor $C_1$ and the capacitance of at least one of second and third capacitors $C_2$ and $C_3$, according to some embodiments. In some embodiments, capacitor structure 300 is a decoupling capacitor electrically connected to the power line and the ground of the 3D semiconductor device. FIGS. 4A, 4B, 5A, 5B, 6A, 6B, 7A, and 7B below illustrate in detail various non-limiting examples of the designs for implementing capacitor structure 300.

Figure 4A:
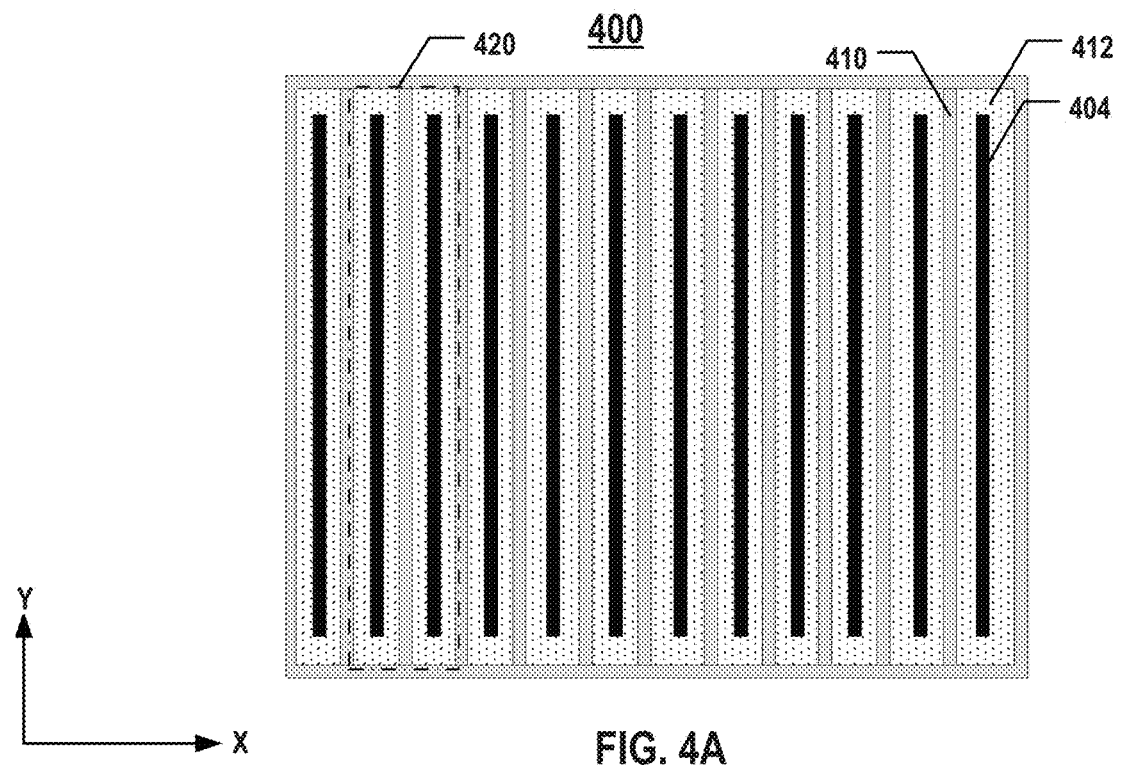
FIGS. 4A and 4B illustrate a plan view and a side view, respectively, of cross-sections of an exemplary 3D semiconductor device having on-chip capacitors, according to some embodiments of the present disclosure.
Figure 4B:
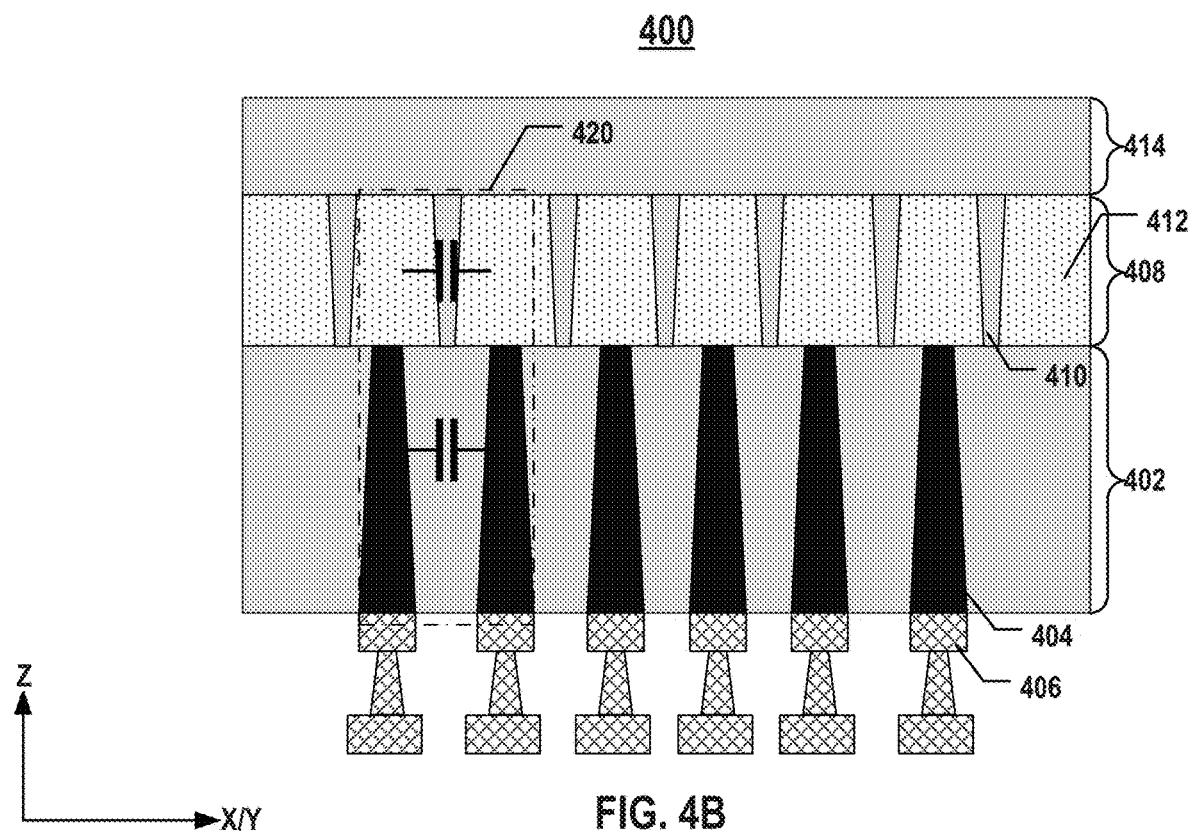

FIGS. 4A and 4B illustrate a plan view and a side view, respectively, of cross-sections of an exemplary 3D semiconductor device 400 having on-chip capacitors, according to some embodiments of the present disclosure. 3D semiconductor device 400 can include a semiconductor layer 408 and a first ILD layer 402 in contact with a first side of semiconductor layer 408. In some embodiments, semiconductor layer 408 is a thinned substrate, such as a thinned silicon substrate, and first ILD layer 402 is formed on the front side of the thinned substrate. As shown in FIG. 4B, 3D semiconductor device 400, such as first semiconductor structure 102 (the memory array chip) in 3D memory device 100, is flipped upside down (i.e., the front side of the thinned substrate facing down) to be stacked on another semiconductor structure (not shown), such that first ILD layer 402 is below and in contact with semiconductor layer 408. It is understood that the relative positions of the components in 3D semiconductor device 400, such as semiconductor layer 408 and first ILD layer 402, may be changed accordingly if the front side and backside of 3D semiconductor device 400 are reversed.

First ILD layer 402 can include dielectric materials including, but not limited to, silicon oxide, silicon nitride, silicon oxynitride, low-k dielectrics, or any combination thereof. In some embodiments, first ILD layer 402 includes silicon oxide, and semiconductor layer 408 includes silicon. It is understood that ILD layer 402 may include multiple sublayers in some examples, such as one or more silicon oxide layers and one or more silicon nitride layers. ILD layer 402 can have a relatively large thickness compared with other ILD layers in 3D semiconductor device 400. In some embodiments in which 3D semiconductor device 400 is a memory array chip (e.g., first semiconductor structure 102 in FIG. 1), 3D semiconductor device 400 also includes a memory stack (e.g., memory stack 114 in FIG. 1, not shown in FIGS. 4A and 4B) on the same side of semiconductor layer 408 as first ILD layer 402 and substantially coplanar with first ILD layer 402, such that the thickness of ILD layer 402 is equal to or greater than the thickness of the memory stack. 3D semiconductor device 400 may also include channel structures (e.g., channel structures 124 in FIG. 1, not shown in FIGS. 4A and 4B) each extending vertically through the memory stack and in contact with semiconductor layer 408.

3D semiconductor device 400 also includes a plurality of first contacts 404 each extending vertically through first ILD layer 402 and in contact with the front side of semiconductor layer 408. First contacts 404 can be formed in a peripheral region outside of the memory stack, such as peripheral region 204 in FIG. 2. In some embodiments, the depth of first contact 404 is nominally the same as the thickness of first ILD layer 402. Each first contact 404 can include one or more conductive layers, such as a metal layer (e.g., W, Co, Cu, or Al) or a silicide layer surrounded by an adhesive/barrier layer (e.g., TiN). As shown in FIG. 4A, in some embodiments, first contacts 404 can include parallel wall-shaped contacts extending laterally (e.g., in the y-direction in FIG. 4A or in the x-direction in other examples).

In some embodiments, 3D semiconductor device 400 further includes a plurality of dielectric cuts 410 each extending vertically through semiconductor layer 408 to separate semiconductor layer 408 into a plurality of semiconductor blocks 412. Each dielectric cut 410 can be an opening, e.g., a trench, filled with dielectric materials including, but not limited to, silicon oxide, silicon nitride, silicon oxynitride, low-k dielectrics, or any combination thereof. In some embodiments, dielectric cuts 410 include silicon oxide. As shown in FIGS. 4A and 4B, dielectric cuts 410 can include parallel wall-shaped dielectric cuts each extending vertically through semiconductor layer 408 and extending laterally (e.g., in the y-direction in FIG. 4A or in the x-direction in other examples) to form laterally interleaved dielectric cuts 410 and semiconductor blocks 412. In some embodiments, the thickness of dielectric cut 410 is nominally the same as the thickness of semiconductor layer 408 and semiconductor block 412. In some embodiments, the lateral dimension (e.g., the length in the y-direction in FIG. 4A) of dielectric cut 410 is nominally the same as the lateral dimension (e.g., the length in the y-direction in FIG. 4A) of semiconductor layer 408 to cut off semiconductor layer 408 into separate semiconductor blocks 412, such that semiconductor blocks 412 are electrically insulated from one another by dielectric cuts 410. In some embodiments, dielectric cuts 410 and first contacts 404 are parallel to one another in the plan view, as shown in FIG. 4A. Each semiconductor block 412 is part of semiconductor layer 408 and thus, has the same material of semiconductor layer 408, for example, silicon, according to some embodiments.

As shown in FIG. 4B, first contacts 404 are below and in contact with semiconductor blocks 412, respectively, according to some embodiments. That is, each first contact 404 can be in contact with and electrically connected to one of semiconductor blocks 412. In some embodiments, 3D semiconductor device 400 further includes an interconnect layer 406, such as a MEOL interconnect layer and/or a BEOL interconnect layer, in contact with and electrically connected to first contacts 404. In some embodiments, 3D semiconductor device 400 further includes a second ILD layer 414 in contact with a second side, e.g., the backside of semiconductor layer 408. That is, first and second ILD layers 402 and 414 can be formed on opposite sides of semiconductor layer 408, e.g., a thinned substrate. Second ILD layer 414 can include dielectric materials including, but not limited to, silicon oxide, silicon nitride, silicon oxynitride, low-k dielectrics, or any combination thereof. In some embodiments, second ILD layer 414 includes silicon oxide. It is understood that second ILD layer 414 may include multiple sublayers in some examples, such as one or more silicon oxide layers and one or more silicon nitride layers. In some embodiments, the thickness of first ILD layer 402 is greater than the thickness of second ILD layer 414.

As shown in FIGS. 4A and 4B, a plurality of capacitor structures 420 can be formed in 3D semiconductor device 400 based on components described above. In some embodiments, an adjacent pair of first contacts 404, part of first ILD layer 402 laterally between the adjacent pair of first contacts 404 are configured to form a first capacitor responding to $C_1$ in FIG. 3; an adjacent pair of semiconductor blocks 412 in contact with the adjacent pair of first contacts 404, and dielectric cut 410 laterally between the adjacent pair of semiconductor blocks 412 are configured to form a second capacitor corresponding to $C_2$ in FIG. 3. In some embodiments, the first and second capacitors are in parallel. In other words, an adjacent pair of first contacts 404, part of first ILD layer 402 laterally between the adjacent pair of first contacts 404, an adjacent pair of semiconductor blocks 412 in contact with the adjacent pair of first contacts 404, and dielectric cut 410 laterally between the adjacent pair of semiconductor blocks 412 are configured to form capacitor structure 420 that includes the first and second capacitors in parallel. A voltage can be applied to the capacitor electrodes (e.g., the pair of first contacts 404 and the pair of semiconductor blocks 412) of each capacitor structure 420 through interconnect layer 406, and electric charge can be stored in the capacitor dielectric (e.g., the part of first ILD layer 402 and dielectric cut 410 laterally between the pair of first contacts 404 and the pair of semiconductor blocks 412, respectively). The capacitance of capacitor structure 420 can be determined by various factors including, but not limited to, the dimensions of first contacts 404, dielectric cuts 410, and semiconductor blocks 412, and the materials of first ILD layer 402 and dielectric cuts 410.

Figure 5A:
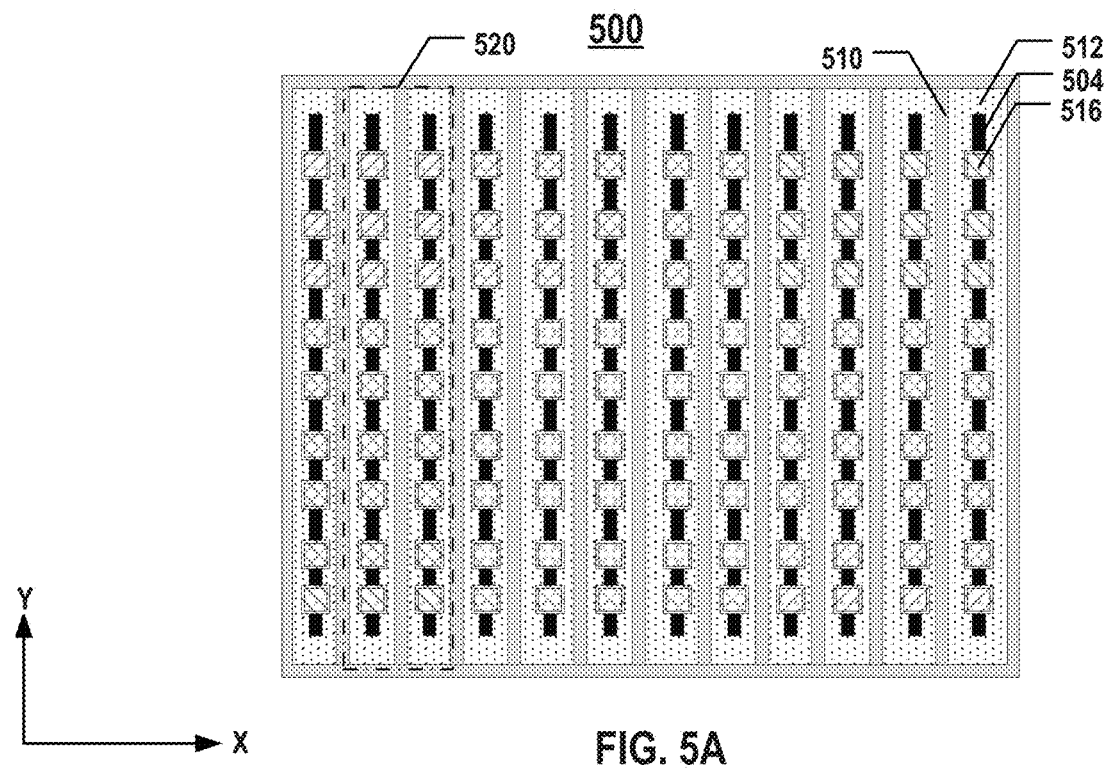
FIGS. 5A and 5B illustrate a plan view and a side view, respectively, of cross-sections of another exemplary 3D semiconductor device having on-chip capacitors, according to some embodiments of the present disclosure.
Figure 5B:
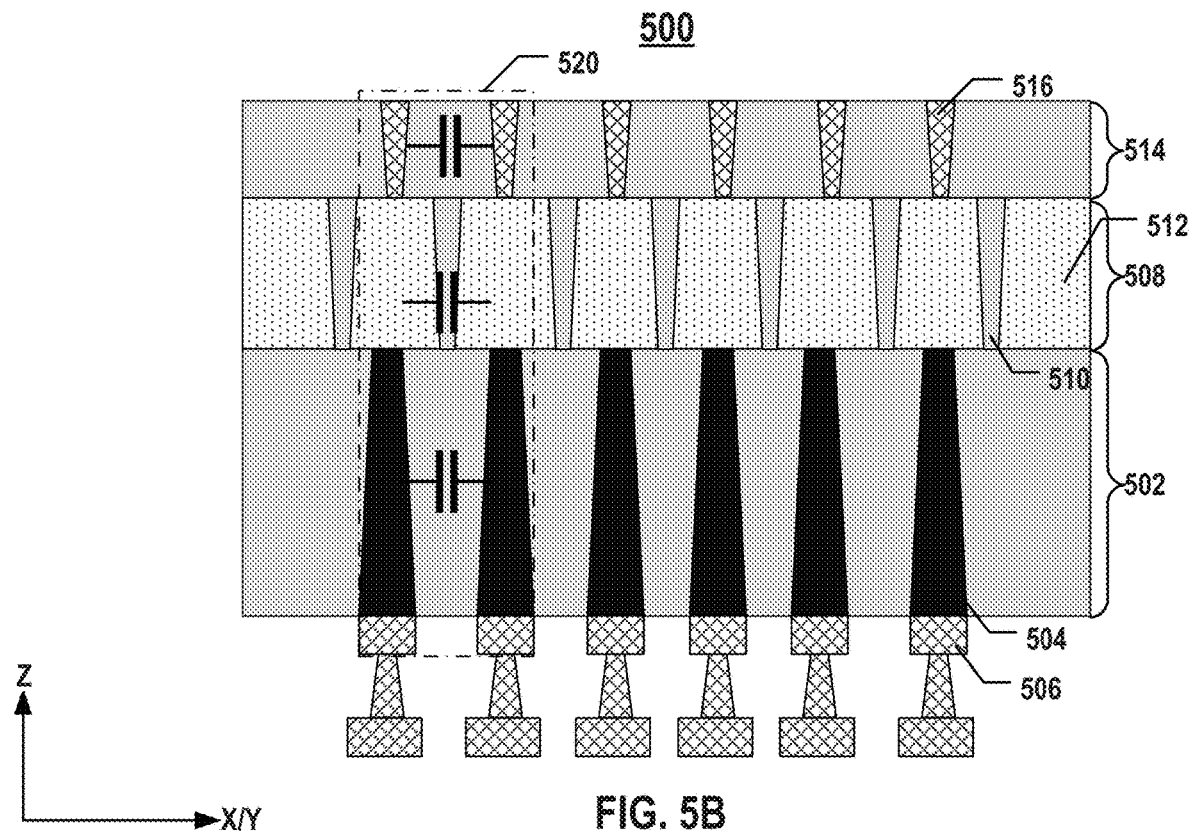

FIGS. 5A and 5B illustrate a plan view and a side view, respectively, of cross-sections of another exemplary 3D semiconductor device 500 having on-chip capacitors, according to some embodiments of the present disclosure. 3D semiconductor device 500 can include a semiconductor layer 508 and a first ILD layer 502 in contact with a first side of semiconductor layer 508. In some embodiments, semiconductor layer 508 is a thinned substrate, such as a thinned silicon substrate, and first ILD layer 502 is formed on the front side of the thinned substrate. As shown in FIG. 5B, 3D semiconductor device 500, such as first semiconductor structure 102 (the memory array chip) in 3D memory device 100, is flipped upside down (i.e., the front side of the thinned substrate facing down) to be stacked on another semiconductor structure (not shown), such that first ILD layer 502 is below and in contact with semiconductor layer 508. It is understood that the relative positions of the components in 3D semiconductor device 500, such as semiconductor layer 508 and first ILD layer 502, may be changed accordingly if the front side and backside of 3D semiconductor device 500 are reversed.

First ILD layer 502 can include dielectric materials including, but not limited to, silicon oxide, silicon nitride, silicon oxynitride, low-k dielectrics, or any combination thereof. In some embodiments, first ILD layer 502 includes silicon oxide, and semiconductor layer 508 includes silicon. It is understood that ILD layer 502 may include multiple sublayers in some examples, such as one or more silicon oxide layers and one or more silicon nitride layers. ILD layer 502 can have a relatively large thickness compared with other ILD layers in 3D semiconductor device 500. In some embodiments in which 3D semiconductor device 500 is a memory array chip (e.g., first semiconductor structure 102 in FIG. 1), 3D semiconductor device 500 also includes a memory stack (e.g., memory stack 114 in FIG. 1, not shown in FIGS. 5A and 5B) on the same side of semiconductor layer 508 as first ILD layer 502 and substantially coplanar with first ILD layer 502, such that the thickness of ILD layer 502 is equal to or greater than the thickness of the memory stack. 3D semiconductor device 500 may also include channel structures (e.g., channel structures 124 in FIG. 1, not shown in FIGS. 5A and 5B) each extending vertically through the memory stack and in contact with semiconductor layer 508.

3D semiconductor device 500 also includes a plurality of first contacts 504 each extending vertically through first ILD layer 502 and in contact with the front side of semiconductor layer 508. First contacts 504 can be formed in a peripheral region outside of the memory stack, such as peripheral region 204 in FIG. 2. In some embodiments, the depth of first contact 504 is nominally the same as the thickness of first ILD layer 502. Each first contact 504 can include one or more conductive layers, such as a metal layer (e.g., W, Co, Cu, or Al) or a silicide layer surrounded by an adhesive/barrier layer (e.g., TiN). As shown in FIG. 5A, in some embodiments, first contacts 504 can include parallel wall-shaped contacts extending laterally (e.g., in the y-direction in FIG. 5A or in the x-direction in other examples).

In some embodiments, 3D semiconductor device 500 further includes a plurality of dielectric cuts 510 each extending vertically through semiconductor layer 508 to separate semiconductor layer 508 into a plurality of semiconductor blocks 512. Each dielectric cut 510 can be an opening, e.g., a trench, filled with dielectric materials including, but not limited to, silicon oxide, silicon nitride, silicon oxynitride, low-k dielectrics, or any combination thereof. In some embodiments, dielectric cuts 510 include silicon oxide. As shown in FIGS. 5A and 5B, dielectric cuts 510 can include parallel wall-shaped dielectric cuts each extending vertically through semiconductor layer 508 and extending laterally (e.g., in the y-direction in FIG. 5A or in the x-direction in other examples) to form laterally interleaved dielectric cuts 510 and semiconductor blocks 512. In some embodiments, the thickness of dielectric cut 510 is nominally the same as the thickness of semiconductor layer 508 and semiconductor block 512. In some embodiments, the lateral dimension (e.g., the length in the y-direction in FIG. 5A) of dielectric cut 510 is nominally the same as the lateral dimension (e.g., the length in the y-direction in FIG. 5A) of semiconductor layer 508 to cut off semiconductor layer 508 into separate semiconductor blocks 512, such that semiconductor blocks 512 are electrically insulated from one another by dielectric cuts 510. In some embodiments, dielectric cuts 510 and first contacts 504 are parallel to one another in the plan view as shown in FIG. 5A. Each semiconductor block 512 is part of semiconductor layer 508 and thus, has the same material of semiconductor layer 508, for example, silicon, according to some embodiments.

As shown in FIG. 5B, first contacts 504 are below and in contact with semiconductor blocks 512, respectively, according to some embodiments. That is, each first contact 504 can be in contact with and electrically connected to one of semiconductor blocks 512. In some embodiments, 3D semiconductor device 500 further includes an interconnect layer 506, such as a MEOL interconnect layer and/or a BEOL interconnect layer, in contact with and electrically connected to first contacts 504.

In some embodiments, 3D semiconductor device 500 further includes a second ILD layer 514 in contact with a second side, e.g., the backside of semiconductor layer 508.

That is, first and second ILD layers 502 and 514 can be formed on opposite sides of semiconductor layer 508, e.g., a thinned substrate. Second ILD layer 514 can include dielectric materials including, but not limited to, silicon oxide, silicon nitride, silicon oxynitride, low-k dielectrics, or any combination thereof. In some embodiments, second ILD layer 514 includes silicon oxide. It is understood that second ILD layer 514 may include multiple sublayers in some examples, such as one or more silicon oxide layers and one or more silicon nitride layers. In some embodiments, the thickness of first ILD layer 502 is greater than the thickness of second ILD layer 514.

Different from 3D semiconductor device 400, 3D semiconductor device 500 further includes a plurality of second contacts 516 each extending vertically through second ILD layer 514 and in contact with one of semiconductor blocks 512 of semiconductor layer 508, according to some embodiments. Each semiconductor block 512 can be below and in contact with one or more second contacts 516. As shown in FIG. 5A, second contacts 516 include a plurality of VIA contacts, as opposed to wall-shaped contacts, according to some embodiments. For example, second contacts 516 may be arranged in rows or columns aligned with first contacts 504 and semiconductor blocks 512 in the plan view, as shown in FIG. 5A. It is understood that in some examples, second contact 516 may be a wall-shaped contact as well, like first contact 504. As shown in FIG. 5B, the depth of second contact 516 can be nominally the same as the thickness of second ILD layer 514. Each second contact 516 can include one or more conductive layers, such as a metal layer (e.g., W, Co, Cu, or Al) or a silicide layer surrounded by an adhesive/barrier layer (e.g., TiN).

As shown in FIGS. 5A and 5B, a plurality of capacitor structures 520 can be formed in 3D semiconductor device 500 based on components described above. In some embodiments, an adjacent pair of first contacts 504, part of first ILD layer 502 laterally between the adjacent pair of first contacts 504 are configured to form a first capacitor responding to $C_1$ in FIG. 3; an adjacent pair of semiconductor blocks 512 in contact with the adjacent pair of first contacts 504, and dielectric cut 510 laterally between the adjacent pair of semiconductor blocks 512 are configured to form a second capacitor corresponding to $C_2$ in FIG. 3; second contacts 516 (e.g., a pair of parallel sets of VIA contacts in FIG. 5A) in contact with the adjacent pair of semiconductor blocks 512, and part of second ILD layer 514 between second contacts 516 are configured to form a third capacitor corresponding to $C_3$ in FIG. 3. In some embodiments, the first, second, and third capacitors are in parallel. In other words, an adjacent pair of first contacts 504, part of first ILD layer 502 laterally between the adjacent pair of first contacts 504, an adjacent pair of semiconductor blocks 512 in contact with the adjacent pair of first contacts 504, dielectric cut 510 laterally between the adjacent pair of semiconductor blocks 512, an adjacent pair of columns of second contacts 516 in contact with the adjacent pair of semiconductor blocks 512, and part of second ILD layer 514 laterally between the adjacent columns of second contacts 516 are configured to form capacitor structure 520 that includes the first, second, and third capacitors in parallel. A voltage can be applied to the capacitor electrodes (e.g., the pair of first contacts 504, the pair of semiconductor blocks 512, and the pair of columns of second contacts 516) of each capacitor structure 520 through interconnect layer 506, and electric charge can be stored in the capacitor dielectric (e.g., the part of first ILD layer 502, dielectric cut 510, and the part of second ILD layer 514 laterally between the pair of first contacts 504, the pair of semiconductor blocks 512, and the pair of columns of second contacts 516, respectively). The capacitance of capacitor structure 520 can be determined by various factors including, but not limited to, the dimensions of first contacts 504, dielectric cuts 510, semiconductor blocks 512, and second contacts 516, and the materials of first ILD layer 502, dielectric cuts 510, and second ILD layer 514.

Figure 6A:
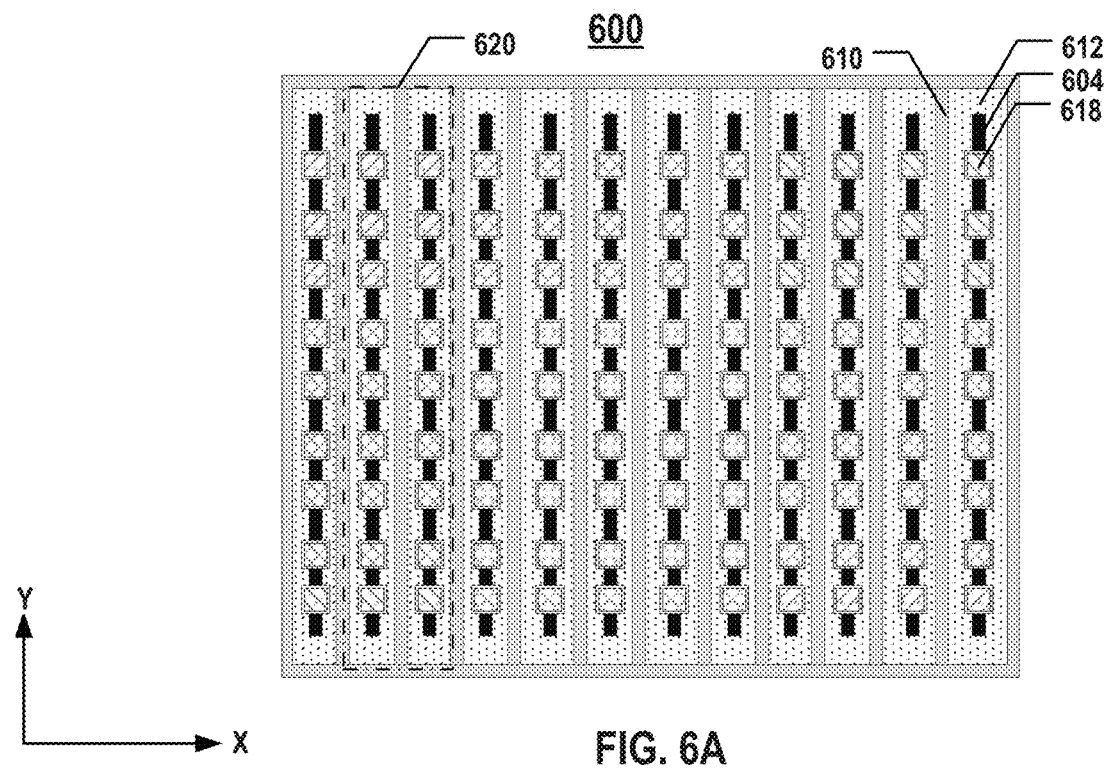
FIGS. 6A and 6B illustrate a plan view and a side view, respectively, of cross-sections of still another exemplary 3D semiconductor device having on-chip capacitors, according to some embodiments of the present disclosure.
Figure 6B:
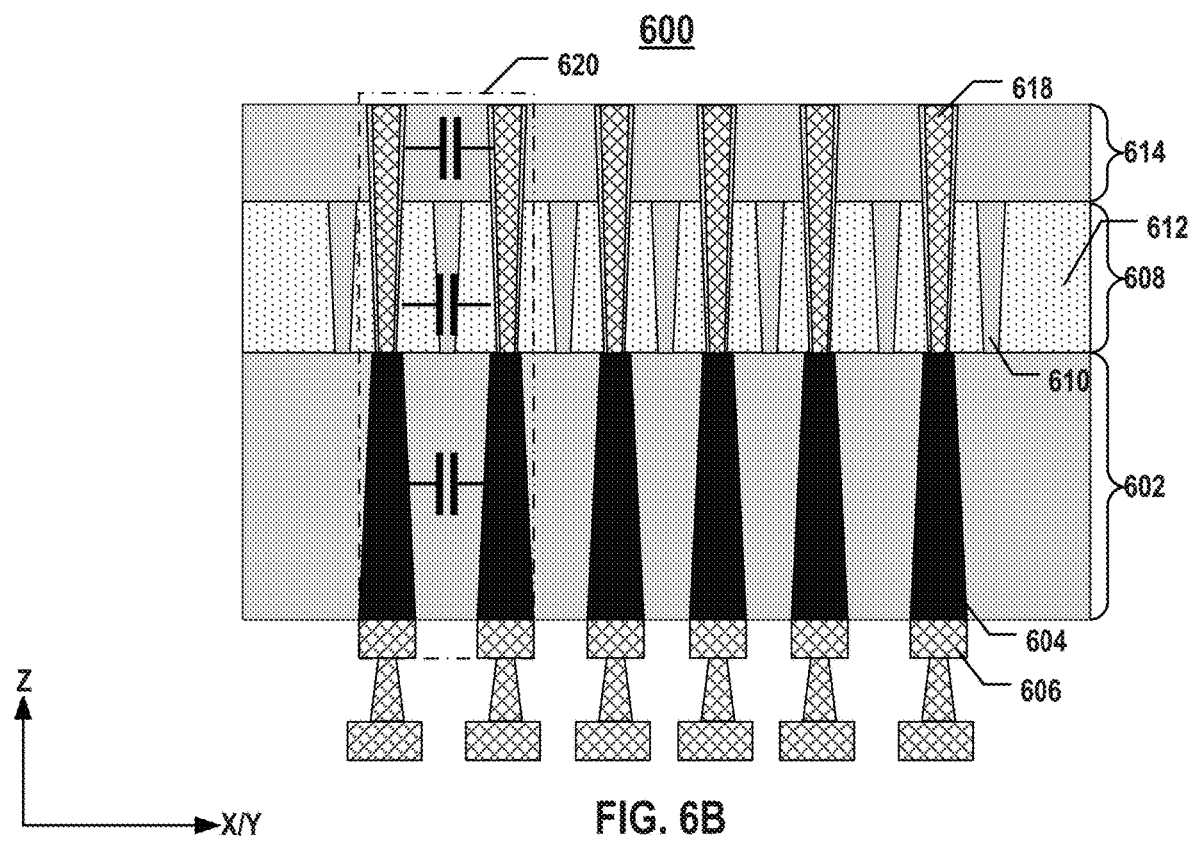

FIGS. 6A and 6B illustrate a plan view and a side view, respectively, of cross-sections of still another exemplary 3D semiconductor device 600 having on-chip capacitors, according to some embodiments of the present disclosure. 3D semiconductor device 600 can include a semiconductor layer 608 and a first ILD layer 602 in contact with a first side of semiconductor layer 608. In some embodiments, semiconductor layer 608 is a thinned substrate, such as a thinned silicon substrate, and first ILD layer 602 is formed on the front side of the thinned substrate. As shown in FIG. 6B, 3D semiconductor device 600, such as first semiconductor structure 102 (the memory array chip) in 3D memory device 100, is flipped upside down (i.e., the front side of the thinned substrate facing down) to be stacked on another semiconductor structure (not shown), such that first ILD layer 602 is below and in contact with semiconductor layer 608. It is understood that the relative positions of the components in 3D semiconductor device 600, such as semiconductor layer 608 and first ILD layer 602, may be changed accordingly if the front side and backside of 3D semiconductor device 600 are reversed.

First ILD layer 602 can include dielectric materials including, but not limited to, silicon oxide, silicon nitride, silicon oxynitride, low-k dielectrics, or any combination thereof. In some embodiments, first ILD layer 602 includes silicon oxide, and semiconductor layer 608 includes silicon. It is understood that ILD layer 602 may include multiple sublayers in some examples, such as one or more silicon oxide layers and one or more silicon nitride layers. ILD layer 602 can have a relatively large thickness compared with other ILD layers in 3D semiconductor device 600. In some embodiments in which 3D semiconductor device 600 is a memory array chip (e.g., first semiconductor structure 102 in FIG. 1), 3D semiconductor device 600 also includes a memory stack (e.g., memory stack 114 in FIG. 1, not shown in FIGS. 6A and 6B) on the same side of semiconductor layer 608 as first ILD layer 602 and substantially coplanar with first ILD layer 602, such that the thickness of ILD layer 602 is equal to or greater than the thickness of the memory stack. 3D semiconductor device 600 may also include channel structures (e.g., channel structures 124 in FIG. 1, not shown in FIGS. 6A and 6B) each extending vertically through the memory stack and in contact with semiconductor layer 608.

3D semiconductor device 600 also includes a plurality of first contacts 604 each extending vertically through first ILD layer 602 and in contact with the front side of semiconductor layer 508. First contacts 604 can be formed in a peripheral region outside of the memory stack, such as peripheral region 204 in FIG. 2. In some embodiments, the depth of first contact 604 is nominally the same as the thickness of first ILD layer 602. Each first contact 604 can include one or more conductive layers, such as a metal layer (e.g., W, Co, Cu, or Al) or a silicide layer surrounded by an adhesive/barrier layer (e.g., TiN). As shown in FIG. 6A, in some embodiments, first contacts 604 can include parallel wall-shaped contacts extending laterally (e.g., in the y-direction in FIG. 6A or in the x-direction in other examples).

In some embodiments, 3D semiconductor device 600 further includes a plurality of dielectric cuts 610 each extending vertically through semiconductor layer 608 to separate semiconductor layer 608 into a plurality of semiconductor blocks 612. Each dielectric cut 610 can be an opening, e.g., a trench, filled with dielectric materials including, but not limited to, silicon oxide, silicon nitride, silicon oxynitride, low-k dielectrics, or any combination thereof. In some embodiments, dielectric cuts 610 include silicon oxide. As shown in FIGS. 6A and 6B, dielectric cuts 610 can include parallel wall-shaped dielectric cuts each extending vertically through semiconductor layer 608 and extending laterally (e.g., in the y-direction in FIG. 6A or in the x-direction in other examples) to form laterally interleaved dielectric cuts 610 and semiconductor blocks 612. In some embodiments, the thickness of dielectric cut 610 is nominally the same as the thickness of semiconductor layer 608 and semiconductor block 612. In some embodiments, the lateral dimension (e.g., the length in the y-direction in FIG. 6A) of dielectric cut 610 is nominally the same as the lateral dimension (e.g., the length in the y-direction in FIG. 6A) of semiconductor layer 608 to cut off semiconductor layer 608 into separate semiconductor blocks 612, such that semiconductor blocks 612 are electrically insulated from one another by dielectric cuts 610. In some embodiments, dielectric cuts 610 and first contacts 604 are parallel to one another in the plan view, as shown in FIG. 6A. Each semiconductor block 612 is part of semiconductor layer 608 and thus, has the same material of semiconductor layer 608, for example, silicon, according to some embodiments.

First contacts 604 are below and in contact with semiconductor blocks 612, respectively, according to some embodiments. That is, each first contact 604 can be in contact with and electrically connected to one of semiconductor blocks 612. In some embodiments, 3D semiconductor device 600 further includes an interconnect layer 606, such as a MEOL interconnect layer and/or a BEOL interconnect layer, in contact with and electrically connected to first contacts 604.

In some embodiments, 3D semiconductor device 600 further includes a second ILD layer 614 in contact with a second side, e.g., the backside of semiconductor layer 608. That is, first and second ILD layers 602 and 614 can be formed on opposite sides of semiconductor layer 608, e.g., a thinned substrate. Second ILD layer 614 can include dielectric materials including, but not limited to, silicon oxide, silicon nitride, silicon oxynitride, low-k dielectrics, or any combination thereof. In some embodiments, second ILD layer 614 includes silicon oxide. It is understood that second ILD layer 614 may include multiple sublayers in some examples, such as one or more silicon oxide layers and one or more silicon nitride layers. In some embodiments, the thickness of first ILD layer 602 is greater than the thickness of second ILD layer 614.

Different from 3D semiconductor devices 400 and 500, 3D semiconductor device 600 further includes a plurality of third contacts 618 each extending vertically through both second ILD layer 614 and semiconductor layer 608 and in contact with one of first contacts 604, according to some embodiments. Each first contact 604 can be below and in contact with one or more third contacts 618. As shown in FIG. 6A, third contacts 618 include a plurality of VIA contacts, as opposed to wall-shaped contacts, according to some embodiments. For example, third contacts 618 may be arranged in rows or columns aligned with first contacts 604 and semiconductor blocks 612 in the plan view, as shown in FIG. 6A. In some embodiments, each first contact 604 is in contact with and electrically connected to a respective semiconductor block 612 as well as a respective set of third contacts 618, as shown in FIG. 6A. It is understood that in some examples, third contact 618 may be a wall-shaped contact as well, like first contact 604. As shown in FIG. 6B, the depth of third contact 618 can be nominally the same as the total thickness of second ILD layer 614 and semiconductor layer 608. Each third contact 618 can include one or more conductive layers, such as a metal layer (e.g., W, Co, Cu, or Al) or a silicide layer surrounded by an adhesive/barrier layer (e.g., TiN). In some embodiments, a spacer including dielectrics is formed surrounding each third contact 618 to electrically insulate third contact 618 from a respective semiconductor block 612 of semiconductor layer 608.

As shown in FIGS. 6A and 6B, a plurality of capacitor structures 620 can be formed in 3D semiconductor device 600 based on components described above. In some embodiments, an adjacent pair of first contacts 604, part of first ILD layer 602 laterally between the adjacent pair of first contacts 604 are configured to form a first capacitor responding to $C_1$ in FIG. 3; an adjacent pair of semiconductor blocks 612 in contact with the adjacent pair of first contacts 604, and dielectric cut 610 laterally between the adjacent pair of semiconductor blocks 612 are configured to form a second capacitor corresponding to $C_2$ in FIG. 3; third contacts 618 (e.g., a pair of parallel sets of VIA contacts in FIG. 6A) in contact with the adjacent pair of first contacts 604, and part of second ILD layer 614 between third contacts 618 are configured to form a third capacitor corresponding to $C_3$ in FIG. 3. In some embodiments, the first, second, and third capacitors are in parallel. In other words, an adjacent pair of first contacts 604, part of first ILD layer 602 laterally between the adjacent pair of first contacts 604, an adjacent pair of semiconductor blocks 612 in contact with the adjacent pair of first contacts 604, dielectric cut 610 laterally between the adjacent pair of semiconductor blocks 612, an adjacent pair of columns of third contacts 618 in contact with the adjacent pair of first contacts 604, and part of second ILD layer 614 laterally between the adjacent columns of third contacts 618 are configured to form capacitor structure 620 that includes the first, second, and third capacitors in parallel. It is understood that the adjacent columns of third contacts 618 and dielectric cut 610 therebetween may also contribute to the second capacitor of capacitor structure 620 depending on the dimensions of third contacts 618. A voltage can be applied to the capacitor electrodes (e.g., the pair of first contacts 604, the pair of semiconductor blocks 612, and the pair of columns of third contacts 618) of each capacitor structure 620 through interconnect layer 606, and electric charge can be stored in the capacitor dielectric (e.g., the part of first ILD layer 602, dielectric cut 610, and the part of second ILD layer 614 laterally between the pair of first contacts 604, the pair of semiconductor blocks 612, and the pair of columns of third contacts 618, respectively). The capacitance of capacitor structure 620 can be determined by various factors including, but not limited to, the dimensions of first contacts 604, dielectric cuts 610, semiconductor blocks 612, and third contacts 618, and the materials of first ILD layer 602, dielectric cuts 610, and second ILD layer 614.

Figure 7A:
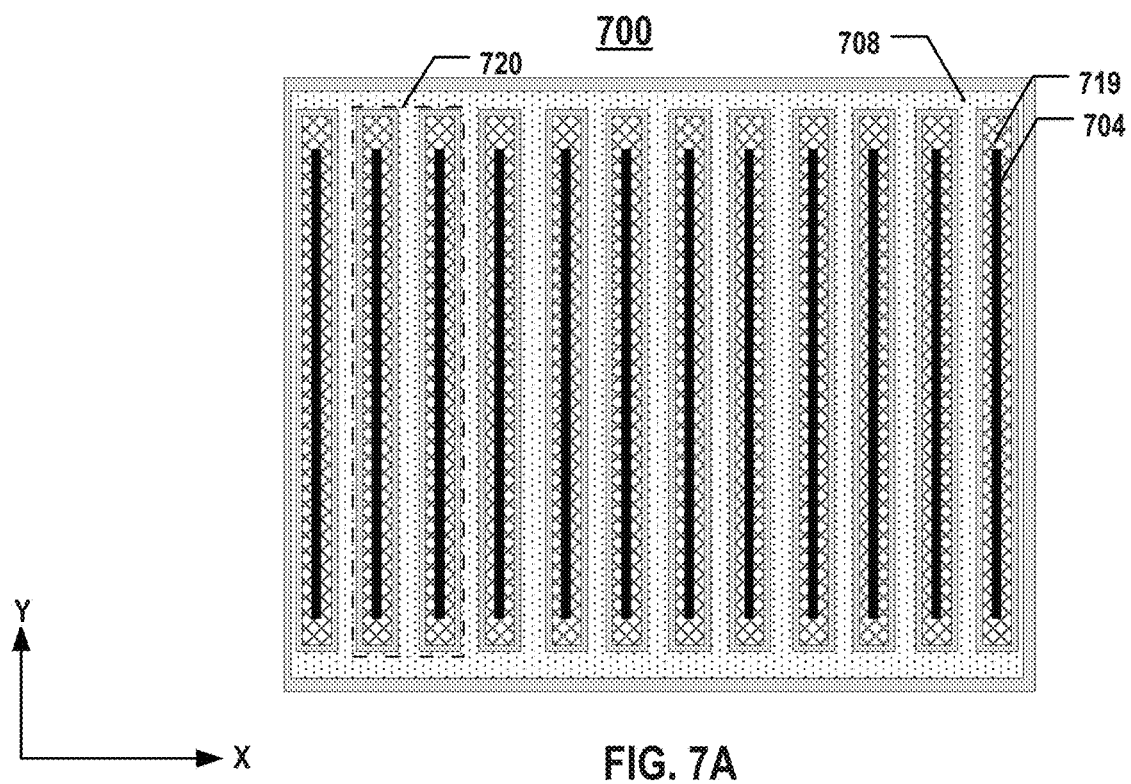
FIGS. 7A and 7B illustrate a plan view and a side view, respectively, of cross-sections of yet another exemplary 3D semiconductor device having on-chip capacitors, according to some embodiments of the present disclosure.
Figure 7B:
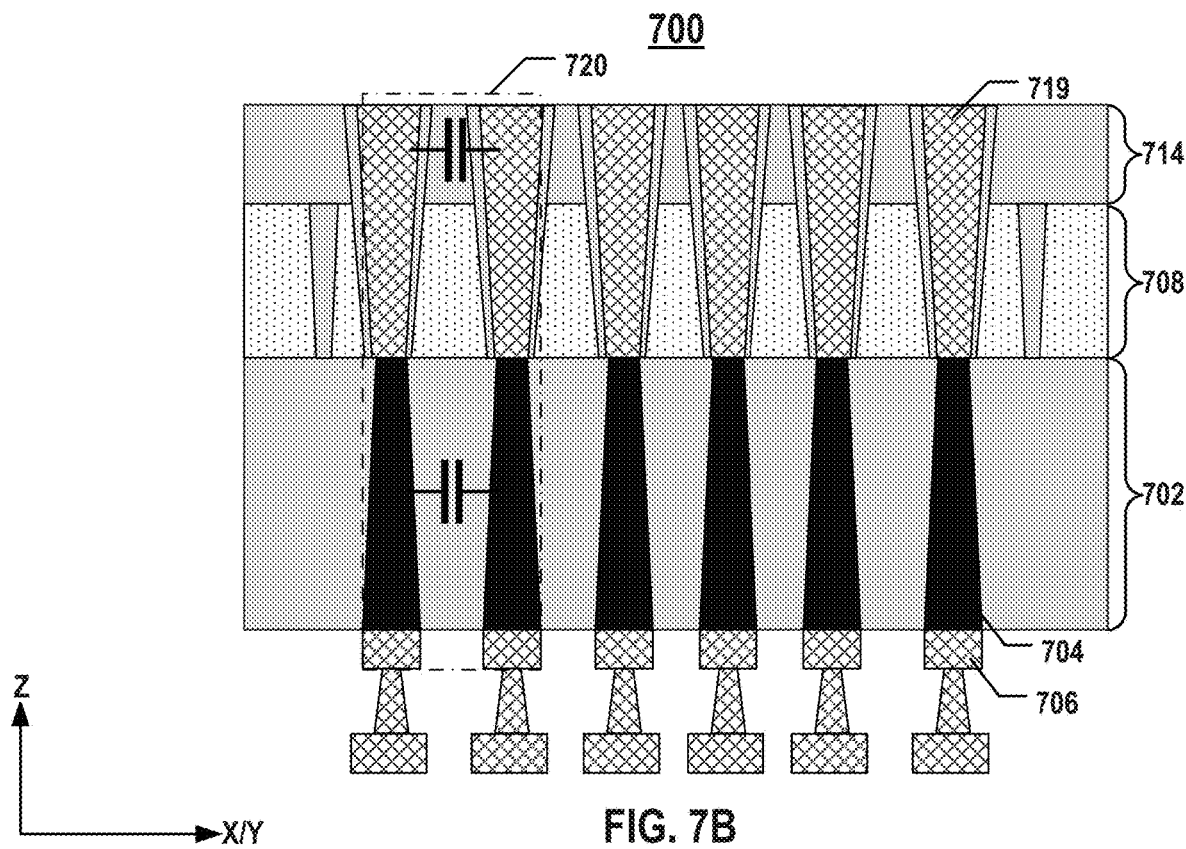

FIGS. 7A and 7B illustrate a plan view and a side view, respectively, of cross-sections of yet another exemplary 3D semiconductor device 700 having on-chip capacitors, according to some embodiments of the present disclosure. 3D semiconductor device 700 can include a semiconductor layer 708 and a first ILD layer 702 in contact with a first side of semiconductor layer 708. In some embodiments, semiconductor layer 708 is a thinned substrate, such as a thinned silicon substrate, and first ILD layer 702 is formed on the front side of the thinned substrate. As shown in FIG. 7B, 3D semiconductor device 700, such as first semiconductor structure 102 (the memory array chip) in 3D memory device 100, is flipped upside down (i.e., the front side of the thinned substrate facing down) to be stacked on another semiconductor structure (not shown), such that first ILD layer 702 is below and in contact with semiconductor layer 708. It is understood that the relative positions of the components in 3D semiconductor device 700, such as semiconductor layer 708 and first ILD layer 702, may be changed accordingly if the front side and backside of 3D semiconductor device 700 are reversed.

First ILD layer 702 can include dielectric materials including, but not limited to, silicon oxide, silicon nitride, silicon oxynitride, low-k dielectrics, or any combination thereof. In some embodiments, first ILD layer 702 includes silicon oxide, and semiconductor layer 708 includes silicon. It is understood that ILD layer 702 may include multiple sublayers in some examples, such as one or more silicon oxide layers and one or more silicon nitride layers. ILD layer 702 can have a relatively large thickness compared with other ILD layers in 3D semiconductor device 700. In some embodiments in which 3D semiconductor device 700 is a memory array chip (e.g., first semiconductor structure 102 in FIG. 1), 3D semiconductor device 700 also includes a memory stack (e.g., memory stack 114 in FIG. 1, not shown in FIGS. 7A and 7B) on the same side of semiconductor layer 708 as first ILD layer 702 and substantially coplanar with first ILD layer 702, such that the thickness of ILD layer 702 is equal to or greater than the thickness of the memory stack. 3D semiconductor device 700 may also include channel structures (e.g., channel structures 124 in FIG. 1, not shown in FIGS. 7A and 7B) each extending vertically through the memory stack and in contact with semiconductor layer 708.

3D semiconductor device 700 also includes a plurality of first contacts 704 each extending vertically through first ILD layer 702 and in contact with the front side of semiconductor layer 708. First contacts 704 can be formed in a peripheral region outside of the memory stack, such as peripheral region 204 in FIG. 2. In some embodiments, the depth of first contact 704 is nominally the same as the thickness of first ILD layer 702. Each first contact 704 can include one or more conductive layers, such as a metal layer (e.g., W, Co, Cu, or Al) or a silicide layer surrounded by an adhesive/barrier layer (e.g., TiN). As shown in FIG. 7A, in some embodiments, first contacts 704 can include parallel wall-shaped contacts extending laterally (e.g., in the y-direction in FIG. 7A or in the x-direction in other examples). In some embodiments, 3D semiconductor device 700 further includes an interconnect layer 706, such as a MEOL interconnect layer and/or a BEOL interconnect layer, in contact with and electrically connected to first contacts 704.

In some embodiments, 3D semiconductor device 700 further includes a second ILD layer 714 in contact with a second side, e.g., the backside of semiconductor layer 708. That is, first and second ILD layers 702 and 714 can be formed on opposite sides of semiconductor layer 708, e.g., a thinned substrate. Second ILD layer 714 can include dielectric materials including, but not limited to, silicon oxide, silicon nitride, silicon oxynitride, low-k dielectrics, or any combination thereof. In some embodiments, second ILD layer 714 includes silicon oxide. It is understood that second ILD layer 714 may include multiple sublayers in some examples, such as one or more silicon oxide layers and one or more silicon nitride layers. In some embodiments, the thickness of first ILD layer 702 is greater than the thickness of second ILD layer 714.

Different from 3D semiconductor devices 400 and 500, 3D semiconductor device 700 further includes a plurality of fourth contacts 719 each extending vertically through both second ILD layer 714 and semiconductor layer 708 and in contact with a respective first contact 704, according to some embodiments. Different from 3D semiconductor device 600, as shown in FIG. 7A, fourth contacts 719 include a plurality of wall-shaped contacts, as opposed to VIA contacts, according to some embodiments. As a result, first contact 704 can be below and in contact with fourth contacts 719, respectively. For example, each fourth contact 719 may be aligned with a respective first contact 704 in the plan view, as shown in FIG. 7A. In some embodiments, each first contact 704 is in contact with and electrically connected to a respective fourth contact 719, but not semiconductor layer 708, when the size of fourth contact 719 is greater than the size of first contact 704 in the plan view. As shown in FIG. 7B, the depth of fourth contact 719 can be nominally the same as the total thickness of second ILD layer 714 and semiconductor layer 708. Each fourth contact 719 can include one or more conductive layers, such as a metal layer (e.g., W, Co, Cu, or Al) or a silicide layer surrounded by an adhesive/barrier layer (e.g., TiN). In some embodiments, a spacer including dielectrics is formed surrounding each fourth contact 719 to electrically insulate fourth contact 719 from semiconductor layer 708.

As shown in FIGS. 7A and 7B, a plurality of capacitor structures 720 can be formed in 3D semiconductor device 700 based on components described above. Different from 3D semiconductor devices 400, 500, and 600, 3D semiconductor device 700 may not include a plurality of dielectric cuts each extending vertically through semiconductor layer 708 to separate semiconductor layer 708 into a plurality of semiconductor blocks for forming capacitor structures 720. It is understood that in some examples, dielectric cuts or similar structures may still be formed in 3D semiconductor device 700, for example, to separate a region from semiconductor layer 708 in which capacitor structures 720 can be formed, which, however, may not directly contribute to the formation of capacitor structures 720.

In some embodiments, an adjacent pair of first contacts 704, part of first ILD layer 702 laterally between the adjacent pair of first contacts 704 are configured to form a first capacitor responding to $C_1$ in FIG. 3; an adjacent pair of fourth contacts 719 in contact with the adjacent pair of first contacts 704, and part of second ILD layer 714 between the adjacent pair of fourth contacts 719 are configured to form a third capacitor corresponding to $C_3$ in FIG. 3. In some embodiments, the first and third capacitors are in parallel. In other words, an adjacent pair of first contacts 704, part of first ILD layer 702 laterally between the adjacent pair of first contacts 704, an adjacent pair of fourth contacts 719 in contact with the adjacent pair of first contacts 604, and part of second ILD layer 714 laterally between the adjacent pair of fourth contacts 719 are configured to form capacitor structure 720 that includes the first and third capacitors in parallel. A voltage can be applied to the capacitor electrodes (e.g., the pair of first contacts 704 and the pair of fourth contacts 719) of each capacitor structure 720 through interconnect layer 706, and electric charge can be stored in the capacitor dielectric (e.g., the part of first ILD layer 702 and the part of second ILD layer 714 laterally between the pair of first contacts 704 and the pair of fourth contacts 719, respectively). The capacitance of capacitor structure 720 can be determined by various factors including, but not limited to, the dimensions of first contacts 704 and fourth contacts 719, and the materials of first ILD layer 702 and second ILD layer 714.

Figure 8A:
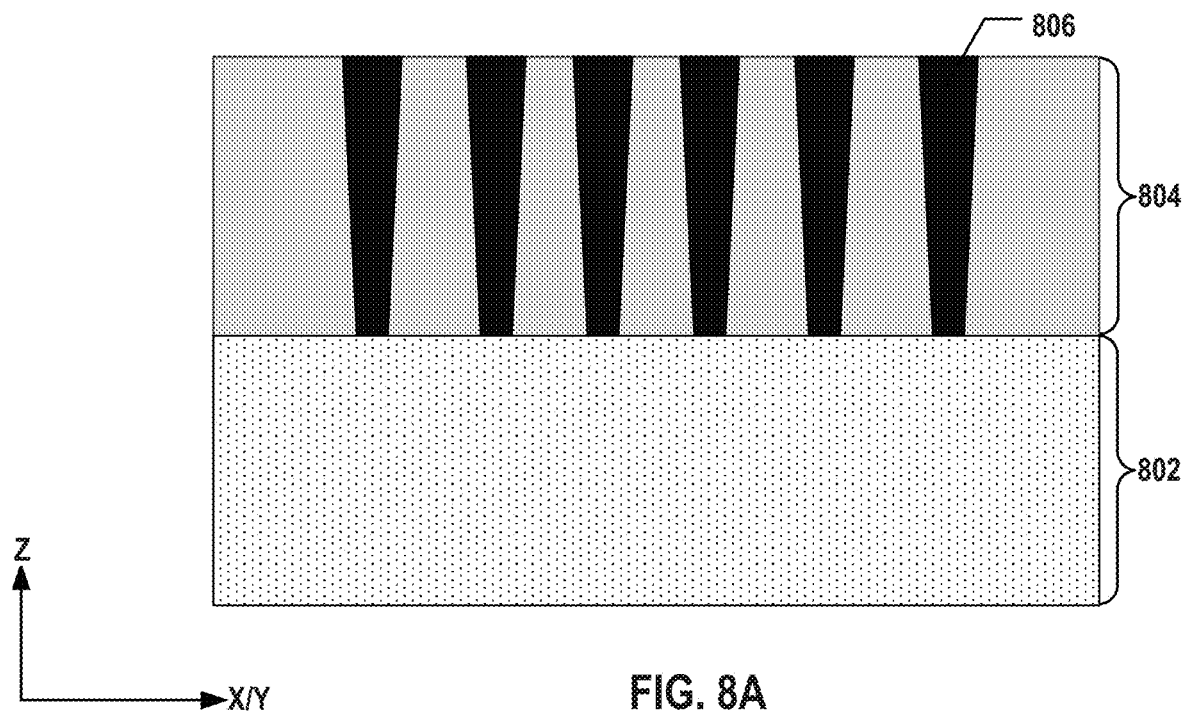
FIGS. 8A-8F illustrate fabrication processes for forming various exemplary 3D semiconductor devices having on-chip capacitors, according to various embodiments of the present disclosure.
Figure 9A:
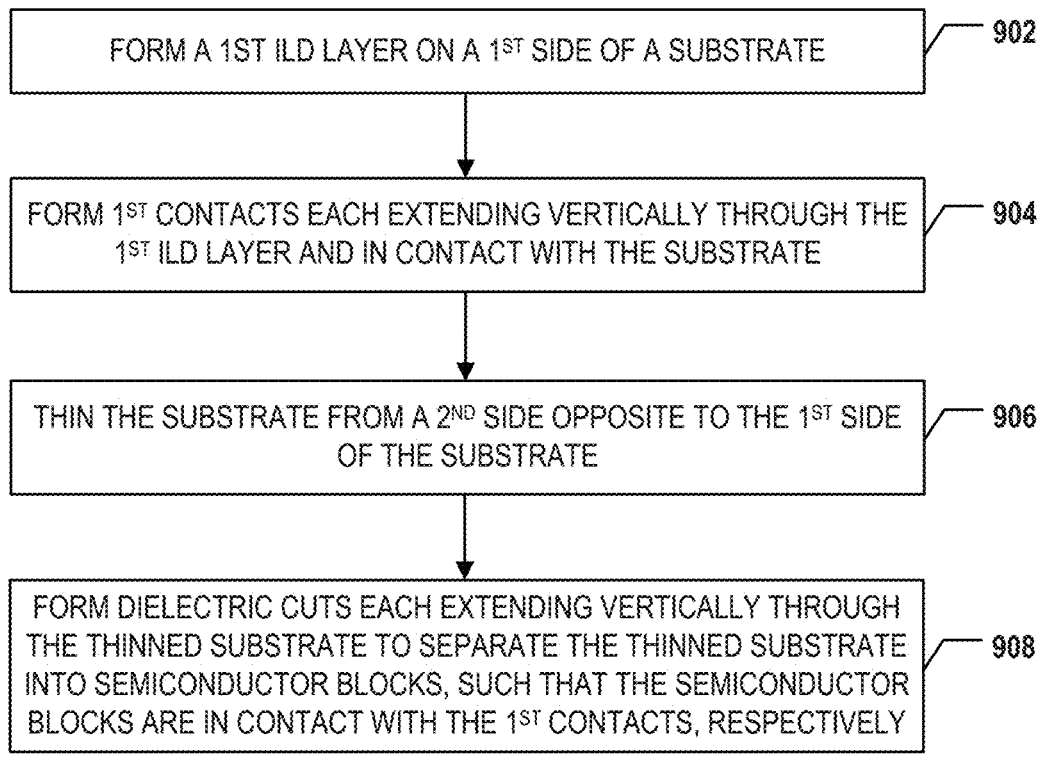
FIGS. 9A-9C illustrate flowcharts of various methods for forming an exemplary 3D semiconductor device having on-chip capacitors, according to some embodiments of the present disclosure.
Figure 9B:
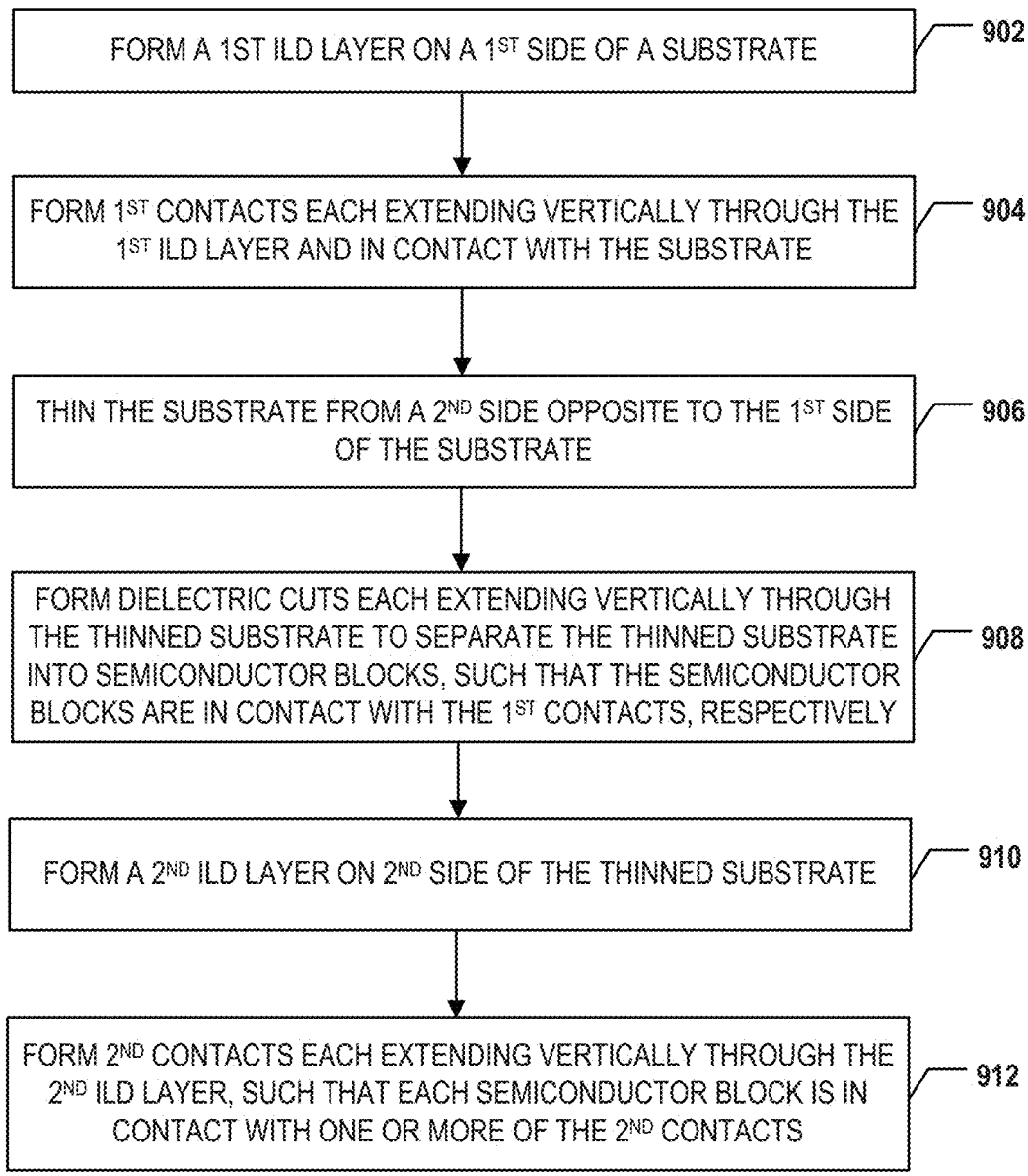
Figure 9C:
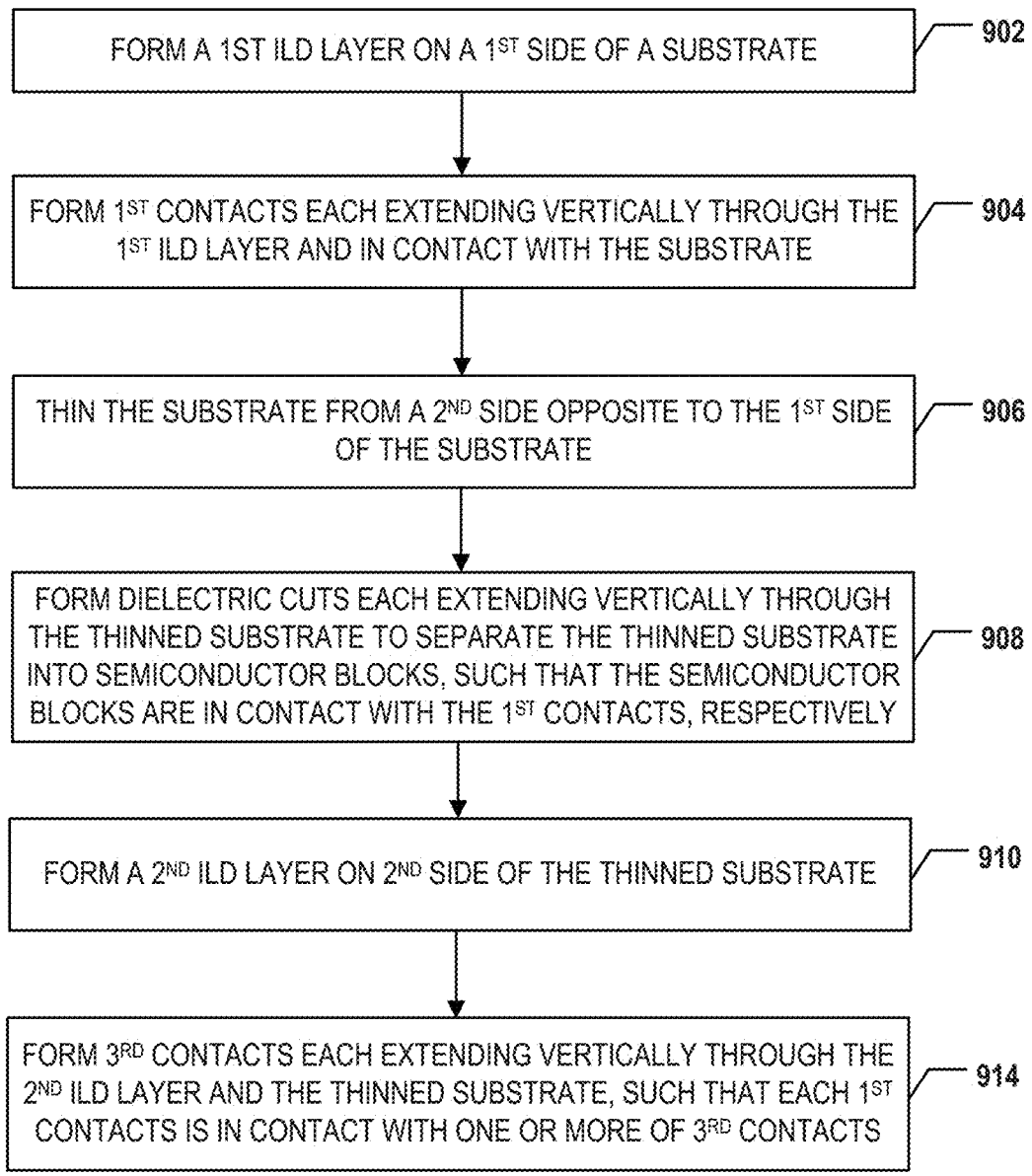
Figure 10:
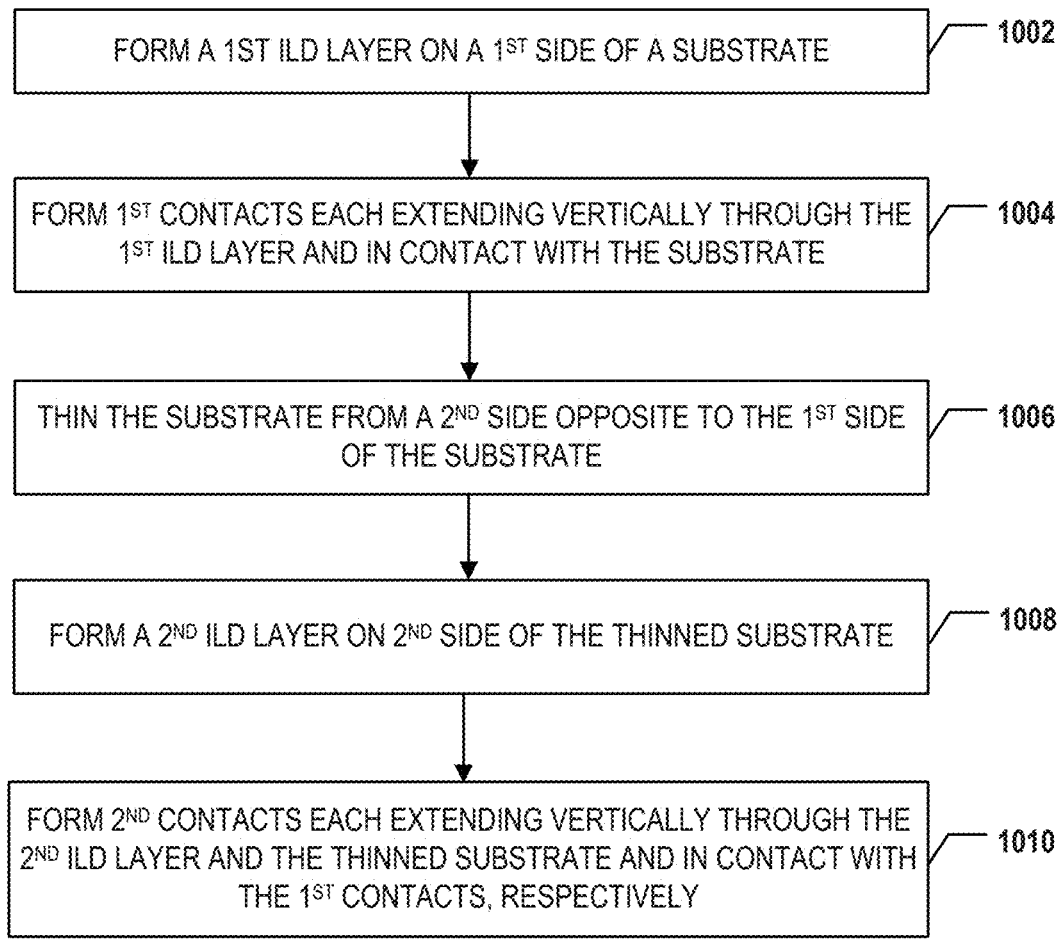
FIG. 10 illustrates a flowchart of a method for forming another exemplary 3D semiconductor device having on-chip capacitors, according to some embodiments of the present disclosure.

FIGS. 8A-8F illustrate fabrication processes for forming various exemplary 3D semiconductor devices having on-chip capacitors, according to various embodiments of the present disclosure. FIGS. 9A-9C illustrate flowcharts of various methods 901, 903, and 905 for forming an exemplary 3D semiconductor device having on-chip capacitors, according to some embodiments of the present disclosure. FIG. 10 illustrates a flowchart of a method 1000 for forming another exemplary 3D semiconductor device having on-chip capacitors, according to some embodiments of the present disclosure. Examples of the 3D semiconductor device depicted in FIGS. 8A-8F, 9A-9C, and 10 include 3D semiconductor devices 400, 500, 600, and 700 depicted in FIGS. 4A, 4B, 5A, 5B, 6A, 6B, 7A, and 7B. FIGS. 8A-8F, 9A-9C, and 10 will be described together. It is understood that the operations shown in methods 901, 903, 905, and 1000 are not exhaustive and that other operations can be performed as well before, after, or between any of the illustrated operations. Further, some of the operations may be performed simultaneously, or in a different order than shown in FIGS. 9A-9C and 10.

Referring to FIGS. 9A-9C, each of methods 901, 903, and 905 starts at operation 902, in which a first ILD layer is formed on a first side of a substrate. The substrate can be a silicon substrate. The first side can be the front side of the substrate. In some embodiments, the first ILD layer includes silicon oxide. As illustrated in FIG. 8A, an ILD layer 804 is formed on the front side of a silicon substrate 802. ILD layer 804 can be formed by depositing one or more dielectric layers, such as silicon oxide layers and/or silicon nitride layers, using one or more thin film deposition processes including, but not limited to, chemical vapor deposition (CVD), physical vapor deposition (PVD), atomic layer deposition (ALD), or any combination thereof.

Each of methods 901, 903, and 905 proceeds to operation 904, as illustrated in FIGS. 9A-9C, in which a plurality of first contacts each extending vertically through the first ILD layer and in contact with the substrate are formed. In some embodiments, the plurality of first contacts include a plurality of parallel wall-shaped contacts. In some embodiments, a memory stack is formed on the first side of the substrate, and a plurality of channel structures each extending vertically through the memory stack and in contact with the substrate are formed. The thickness of the first ILD layer can be equal to or greater than the thickness of the memory stack. In some embodiments, a plurality of word line contacts in contact with the memory stack are formed in the same process for forming the plurality of first contacts.

As illustrated in FIG. 8A, contacts 806 are formed extending vertically through ILD layer 804 to be in contact with the front side of silicon substrate 802. To form contacts 806, contact openings, such as trenches, are first etched through ILD layer 804 using dry etching and/or wet etching, such as reactive ion etch (RIE), stopped at the front side of silicon substrate 802, according to some embodiments. Conductive materials then can be deposited using one or more thin film deposition processes including, but not limited to, CVD, PVD, ALD, or any combination thereof on ILD layer 804 and into the contact openings to form an adhesive/barrier layer and a contact core filling each contact opening. In some embodiments, a planarization process, such as etching and/or CMP, is performed to remove the excess conductive materials and planarize the top surface of ILD layer 804 and contacts 806.

Although not shown in FIG. 8A, it is understood that in some examples in which a 3D memory device (e.g., 3D memory device 100 in FIG. 1) is formed, a memory stack (e.g., memory stack 114 in FIG. 1) may be formed on the front side of silicon structure 802 as well, such that contacts 806 may be formed in a peripheral region outside of the memory stack. Channel structures (e.g., channel structures 124 in FIG. 1) each extending vertically through the memory stack may be formed as well. In some embodiments, word line contacts (e.g., word line local contacts 152 in FIG. 1) in contact with the memory stack are formed in the same process for forming contacts 806, such that the formation of contacts 806 does not introduce extra processes into the fabrication flow. In some embodiments, the thickness of ILD layer 804 and the depth of contact 806 are determined based on the thickness of the memory stack to ensure that the thickness of ILD layer 804 is equal to or greater than the thickness of the memory stack.

Figure 8B:
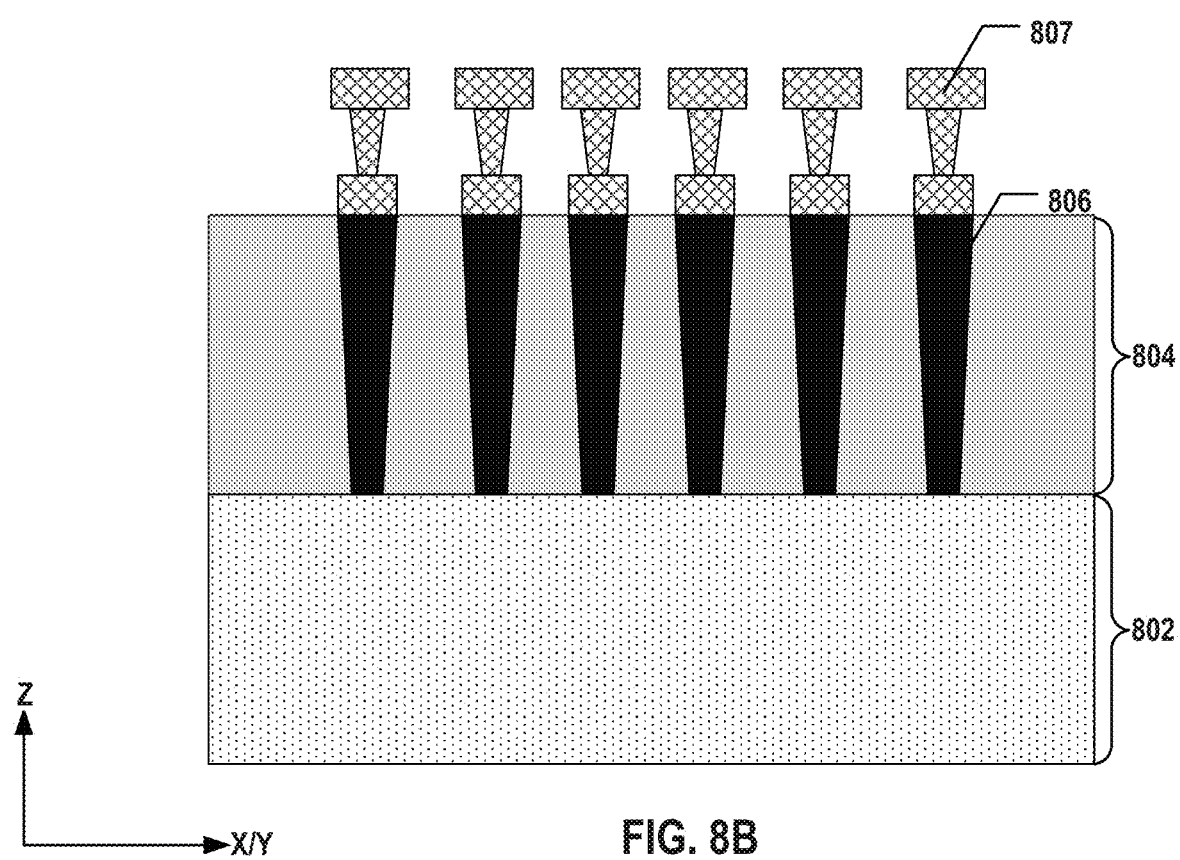

As illustrated in FIG. 8B, an interconnect layer 807 is formed above and in contact with contacts 806. Another ILD layer (not shown) can be formed on ILD layer 804 by depositing dielectric materials, such as silicon oxide or silicon nitride, using one or more thin film deposition processes, such as CVD, PVD, ALD, or any combination thereof, on top of ILD layer 804. Interconnects can be formed by etching contact openings through the ILD layer using wet etching and/or dry etching, e.g., RIE, followed by filling the contact openings with conductive materials using one or more thin film deposition processes, such as ALD, CVD, PVD, any other suitable processes, or any combination thereof.

Figure 8C:
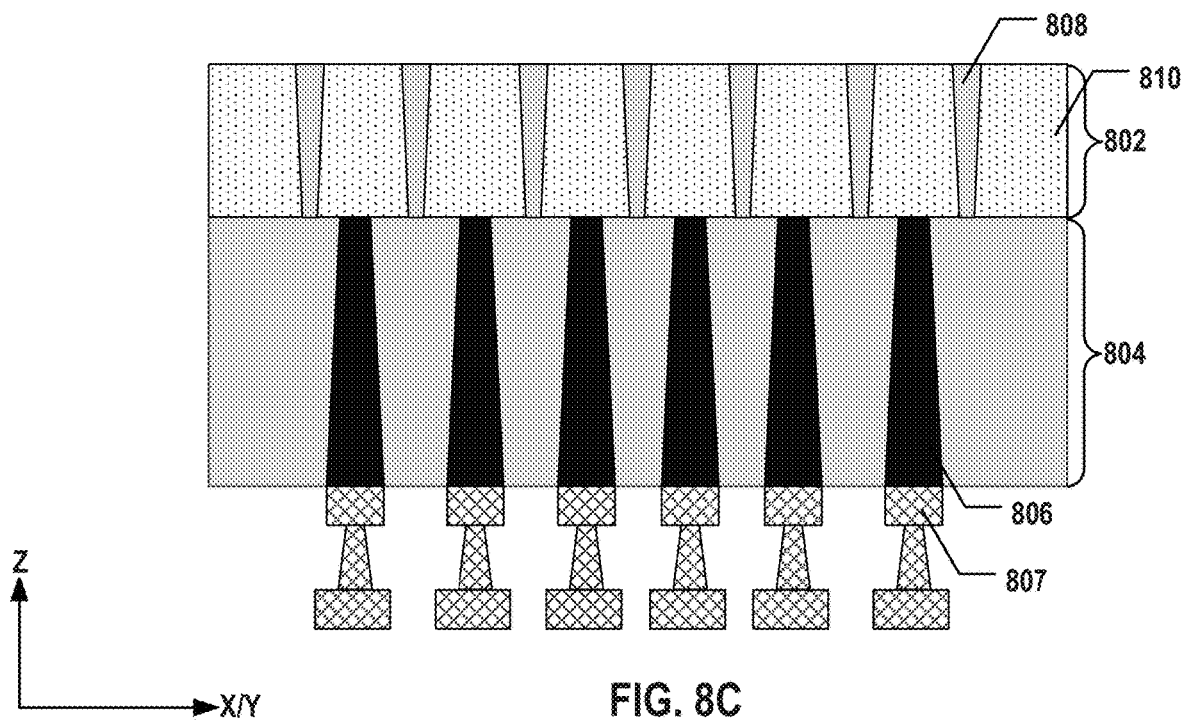

Each of methods 901, 903, and 905 proceeds to operation 906, as illustrated in FIGS. 9A-9C, in which the substrate is thinned from a second side opposite to the first side of the substrate. The second side can be the backside of the substrate. As illustrated in FIG. 8C, silicon substrate 802 (shown in FIG. 8B) and components formed thereon (e.g., ILD layer 804 and contacts 806) are flipped upside down and is thinned from the backside thereof using one or more thinning processes, such as CMP, grinding, and etching, to form a semiconductor layer (i.e., thinned silicon substrate 802).

Each of methods 901, 903, and 905 proceeds to operation 908, as illustrated in FIGS. 9A-9C, in which a plurality of dielectric cuts each extending vertically through the thinned substrate are formed to separate the thinned substrate into a plurality of semiconductor blocks, such that the plurality of semiconductor blocks are in contact with the plurality of first contacts, respectively. In some embodiments, the plurality of dielectric cuts include a plurality of parallel wall-shaped dielectric cuts each extending vertically through the thinned substrate and extending laterally to form laterally interleaved dielectric cuts and semiconductor blocks. In some embodiments as shown in FIG. 9A, a capacitor structure is thereby formed in a 3D semiconductor device (e.g., 3D semiconductor device 400 in FIGS. 4A and 4B). The capacitor structure can include a first capacitor having a pair of the first contacts and part of the first ILD layer therebetween. The capacitor structure can also include a second capacitor having a pair of the semiconductor blocks and the dielectric cut therebetween.

As illustrated in FIG. 8C, dielectric cuts 808 are formed extending vertically through thinned silicon substrate 802 to be in contact with ILD layer 804. Dielectric cuts 808 can separate thinned silicon substrate 802 into separate semiconductor blocks 810, such that semiconductor blocks 810 are in contact with contacts 806, respectively. To form dielectric cuts 808, cut openings, such as trenches, are first patterned using lithography processes based on the locations of contacts 806, such that resulting semiconductor blocks 810 separated by the cut openings are aligned with contacts 806, respectively, according to some embodiments. The patterned cut openings then can be etched through thinned silicon substrate 802 using dry etching and/or wet etching, such as RIE, stopped at ILD layer 804, according to some embodiments. Dielectric materials then can be deposited using one or more thin film deposition processes including, but not limited to, CVD, PVD, ALD, or any combination thereof on the backside of thinned silicon substrate 802 and into the cut openings. In some embodiments, a planarization process, such as etching and/or CMP, is performed to remove the excess dielectric materials and planarize the top surface of thinned silicon substrate 802 and dielectric cuts 808.

Figure 8D:
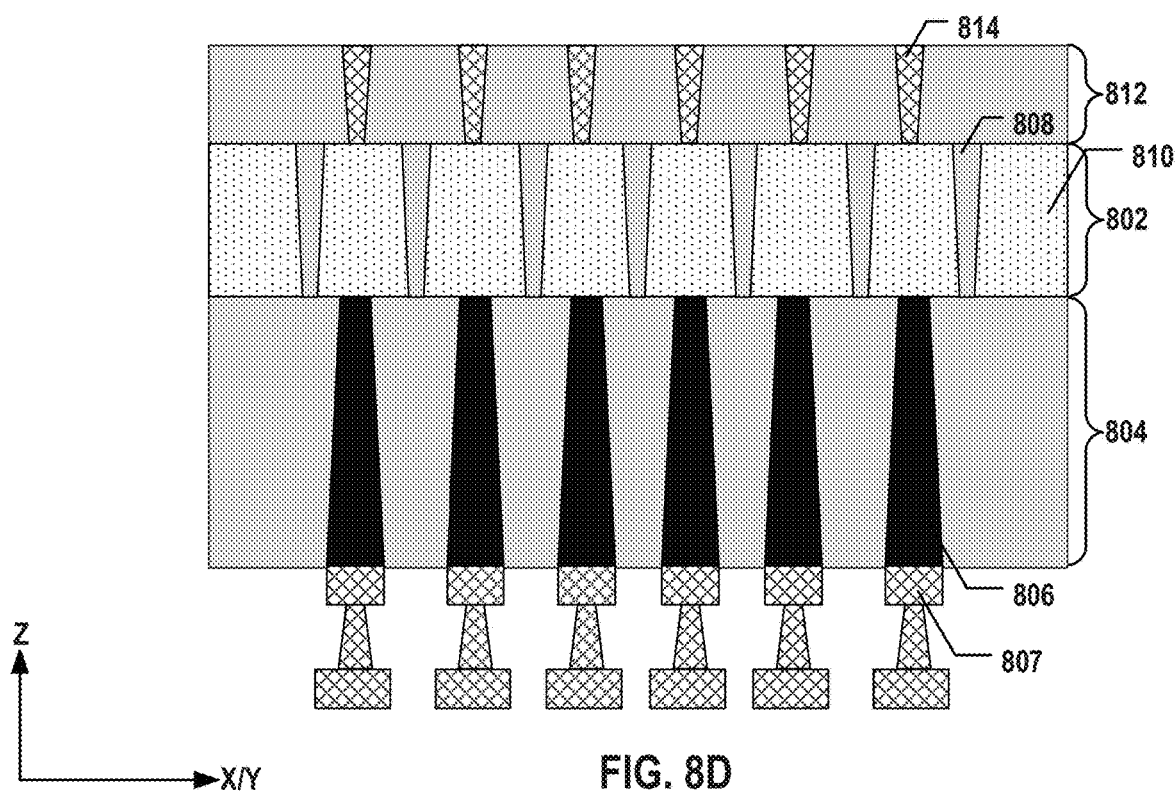
Figure 8E:
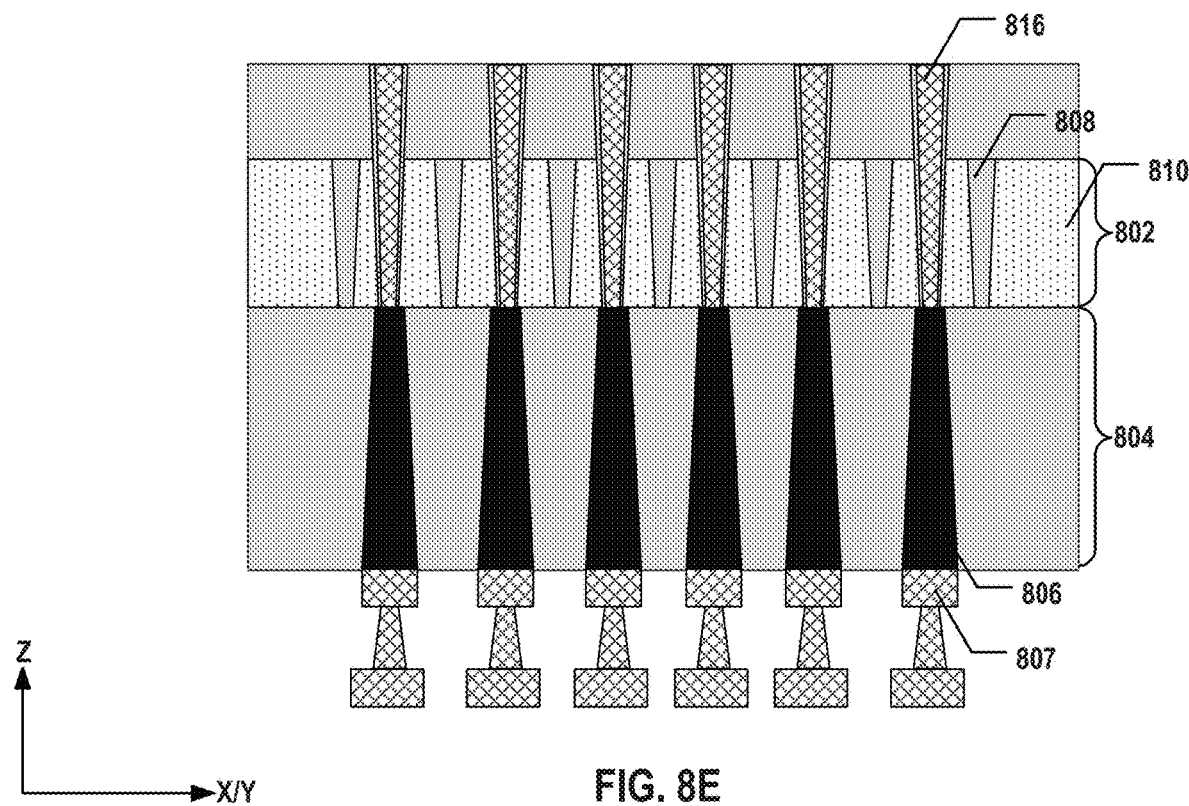

Each of methods 903 and 905 proceeds to operation 910, as illustrated in FIGS. 9B and 9C, in which a second ILD layer is formed on the second side of the thinned substrate. In some embodiments, the second ILD layer includes silicon oxide. As illustrated in FIGS. 8D and 8E, an ILD layer 812 is formed on the backside of thinned silicon substrate 802. ILD layer 812 can be formed by depositing one or more dielectric layers, such as silicon oxide layers and/or silicon nitride layers, using one or more thin film deposition processes including, but not limited to, CVD, PVD, ALD, or any combination thereof.

Method 903 proceeds from operation 910 to operation 912, as illustration FIG. 9B, in which a plurality of second contacts each extending vertically through the second ILD layer are formed, such that each of the plurality of semiconductor blocks is in contact with one or more of the second contacts. In some embodiments, the plurality of second contacts include a plurality of VIA contacts. In some embodiments, a source contact extending vertically through the second ILD layer and in contact with the thinned substrate is formed in the same process for forming the plurality of second contacts. A capacitor structure is thereby formed in a 3D semiconductor device (e.g., 3D semiconductor device 500 in FIGS. 5A and 5B). The capacitor structure can include a first capacitor having a pair of the first contacts and part of the first ILD layer therebetween. The capacitor structure can also include a second capacitor having a pair of the semiconductor blocks and the dielectric cut therebetween. The capacitor can further include a third capacitor having a pair of sets of the second contacts and part of the second ILD layer therebetween.

As illustrated in FIG. 8D, contacts 814 are formed extending vertically through ILD layer 812 to be in contact with semiconductor blocks 810 of thinned silicon substrate 802. To form contacts 814, contact openings, such as VIA holes, are first patterned using lithography processes based on the locations of semiconductor blocks 810, such that each semiconductor block 810 is aligned with a respective set of the contact openings, according to some embodiments. The patterned contact openings then can be etched through ILD layer 812 using dry etching and/or wet etching, such as RIE, stopped at thinned silicon substrate 802, according to some embodiments. Conductive materials then can be deposited using one or more thin film deposition processes including, but not limited to, CVD, PVD, ALD, or any combination thereof on ILD layer 812 and into the contact openings to form an adhesive layer/barrier layer and a contact core of each contact 814. In some embodiments, a planarization process, such as etching and/or CMP, is performed to remove the excess conductive materials and planarize the top surface of ILD layer 812 and contacts 814. In some embodiments, source contacts (e.g., backside source contact 132 in FIG. 1) through ILD layer 812 and in contact with thinned silicon substrate 802 are formed in the same process for forming contacts 814, such that the formation of contacts 814 does not introduce extra processes into the fabrication flow.

Alternatively, method 905 proceeds from operation 910 to operation 914, as illustration FIG. 9C, in which a plurality of third contacts each extending vertically through the second ILD layer and the thinned substrate are formed, such that each of the plurality of first contacts is in contact with one or more of the third contacts. In some embodiments, the plurality of third contacts include a plurality of VIA contacts. In some embodiments, a pad contact extending vertically through the second ILD layer and the thinned substrate is formed in the same process for forming the plurality of third contacts, and a contact pad is formed above and in contact with the pad contact. A capacitor structure is thereby formed in a 3D semiconductor device (e.g., 3D semiconductor device 600 in FIGS. 6A and 6B). The capacitor structure can include a first capacitor having a pair of the first contacts and part of the first ILD layer therebetween. The capacitor structure can also include a second capacitor having a pair of the semiconductor blocks and the dielectric cut therebetween. The capacitor can further include a third capacitor having a pair of sets of the third contacts and part of the second ILD layer therebetween.

As illustrated in FIG. 8E, contacts 816 are formed extending vertically through ILD layer 812 and thinned silicon substrate 802 to be in contact with contacts 806. To form contacts 816, contact openings, such as VIA holes, are first patterned using lithography processes based on the locations of contacts 806, such that each contact 806 is aligned with a respective set of the contact openings, according to some embodiments. The patterned contact openings then can be etched through ILD layer 812 and thinned silicon substrate 802 using dry etching and/or wet etching, such as RIE, stopped at contacts 806, according to some embodiments. Conductive materials then can be deposited using one or more thin film deposition processes including, but not limited to, CVD, PVD, ALD, or any combination thereof on ILD layer 812 and into the contact openings to form an adhesive layer/barrier layer and a contact core of each contact 816. In some embodiments, dielectric materials are deposited into the contact openings first to form spacers. In some embodiments, a planarization process, such as etching and/or CMP, is performed to remove the excess conductive materials and planarize the top surface of ILD layer 812 and contacts 816. In some embodiments, pad contacts (e.g., contact 144 in FIG. 1) through ILD layer 812 and thinned silicon substrate 802 are formed in the same process for forming contacts 816, such that the formation of contacts 816 does not introduce extra processes into the fabrication flow. Contact pads (e.g., contact pad 140 in FIG. 1) then can be formed above and in contact with the pad contacts.

Referring to FIG. 10, method 1000 starts at operation 1002, in which a first ILD layer is formed on a first side of a substrate. The first substrate can be a silicon substrate. The first side can be the front side of the substrate. In some embodiments, the first ILD layer includes silicon oxide. As illustrated in FIG. 8A, an ILD layer 804 is formed on the front side of a silicon substrate 802. ILD layer 804 can be formed by depositing one or more dielectric layers, such as silicon oxide layers and/or silicon nitride layers, using one or more thin film deposition processes including, but not limited to, CVD, PVD, ALD, or any combination thereof.

Method 1000 proceeds to operation 1004, as illustrated in FIG. 10, in which a plurality of first contacts each extending vertically through the first ILD layer and in contact with the substrate are formed. In some embodiments, the plurality of first contacts include a plurality of parallel wall-shaped contacts. In some embodiments, a memory stack is formed on the first side of the substrate, and a plurality of channel structures each extending vertically through the memory stack and in contact with the substrate are formed. The thickness of the first ILD layer can be equal to or greater than the thickness of the memory stack. In some embodiments, a plurality of word line contacts in contact with the memory stack are formed in the same process for forming the plurality of first contacts.

As illustrated in FIG. 8A, contacts 806 are formed extending vertically through ILD layer 804 to be in contact with the front side of silicon substrate 802. To form contacts 806, contact openings, such as trenches, are first etched through ILD layer 804 using dry etching and/or wet etching, such as RIE, stopped at the front side of silicon substrate 802, according to some embodiments. Conductive materials then can be deposited using one or more thin film deposition processes including, but not limited to, CVD, PVD, ALD, or any combination thereof on ILD layer 804 and into the contact openings to form an adhesive/barrier layer and a contact core filling each contact opening. In some embodiments, a planarization process, such as etching and/or CMP, is performed to remove the excess conductive materials and planarize the top surface of ILD layer 804 and contacts 806.

Although not shown in FIG. 8A, it is understood that in some examples in which a 3D memory device (e.g., 3D memory device 100 in FIG. 1) is formed, a memory stack (e.g., memory stack 114 in FIG. 1) may be formed on the front side of silicon structure 802 as well, such that contacts 806 may be formed in a peripheral region outside of the memory stack. Channel structures (e.g., channel structures 124 in FIG. 1) each extending vertically through the memory stack may be formed as well. In some embodiments, word line contacts (e.g., word line local contacts 152 in FIG. 1) in contact with the memory stack are formed in the same process for forming contacts 806, such that the formation of contacts 806 does not introduce extra processes into the fabrication flow. In some embodiments, the thickness of ILD layer 804 and the depth of contact 806 are determined based on the thickness of the memory stack to ensure that the thickness of ILD layer 804 is equal to or greater than the thickness of the memory stack.

As illustrated in FIG. 8B, an interconnect layer 807 is formed above and in contact with contacts 806. Another ILD layer (not shown) can be formed on ILD layer 804 by depositing dielectric materials, such as silicon oxide or silicon nitride, using one or more thin film deposition processes, such as CVD, PVD, ALD, or any combination thereof, on top of ILD layer 804. Interconnects can be formed by etching contact openings through the ILD layer using wet etching and/or dry etching, e.g., RIE, followed by filling the contact openings with conductive materials using one or more thin film deposition processes, such as ALD, CVD, PVD, any other suitable processes, or any combination thereof.

Method 1000 proceeds to operation 1006, as illustrated in FIG. 10, in which the substrate is thinned from a second side opposite to the first side of the substrate. The second side can be the backside of the substrate. As illustrated in FIG. 8C, silicon substrate 802 (shown in FIG. 8B) and components formed thereon (e.g., ILD layer 804 and contacts 806) are flipped upside down and is thinned from the backside thereof using one or more thinning processes, such as CMP, grinding, and etching, to form a semiconductor layer (i.e., thinned silicon substrate 802).

Figure 8F:
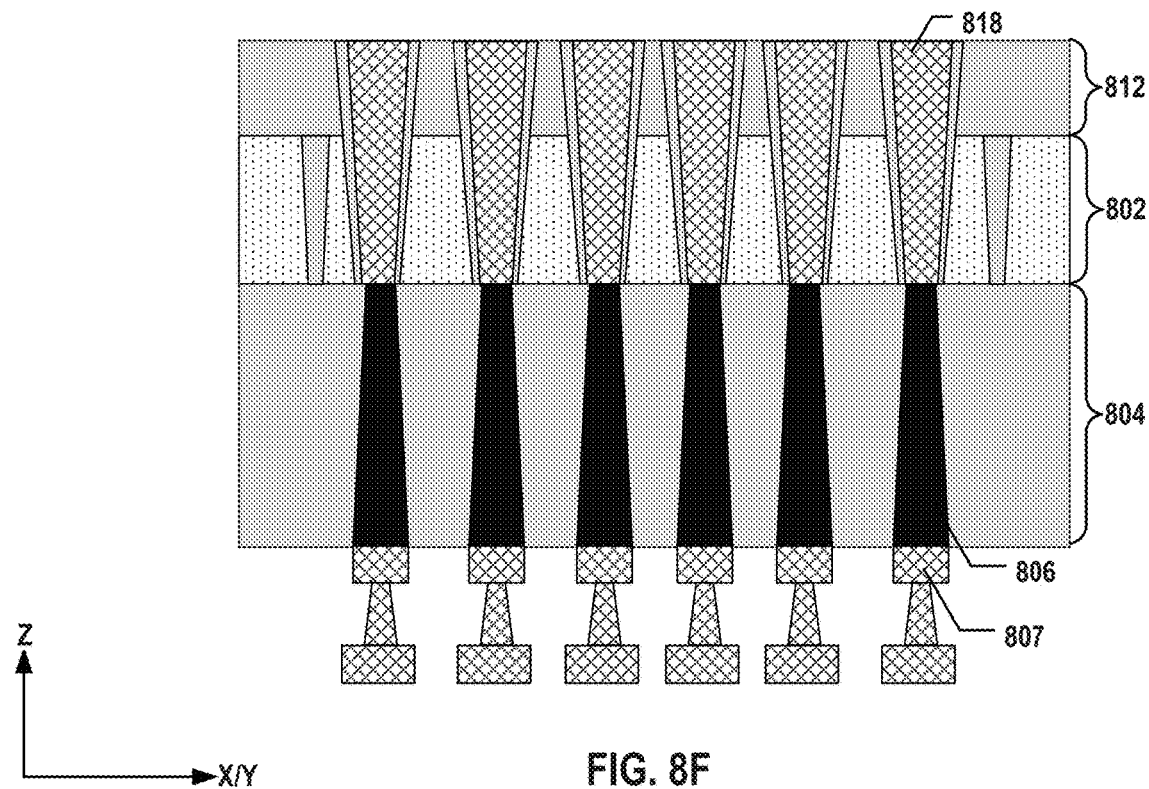

Method 1000 proceeds to operation 1008, as illustrated in FIG. 10, in which a second ILD layer is formed on the second side of the thinned substrate. In some embodiments, the second ILD layer includes silicon oxide. As illustrated in FIG. 8F, ILD layer 812 is formed on the backside of thinned silicon substrate 802. ILD layer 812 can be formed by depositing one or more dielectric layers, such as silicon oxide layers and/or silicon nitride layers, using one or more thin film deposition processes including, but not limited to, CVD, PVD, ALD, or any combination thereof.

Method 1000 proceeds to operation 1010, as illustration FIG. 10, in which a plurality of second contacts each extending vertically through the second ILD layer and the thinned substrate and in contact with the plurality of first contacts, respectively, are formed. In some embodiments, the plurality of second contacts include a plurality of wall-shaped contacts. In some embodiments, a pad contact extending vertically through the second ILD layer and the thinned substrate is formed in the same process for forming the plurality of second contacts, and a contact pad is formed above and in contact with the pad contact. A capacitor structure is thereby formed in a 3D semiconductor device (e.g., 3D semiconductor device 700 in FIGS. 7A and 7B). The capacitor structure can include a first capacitor having a pair of the first contacts and part of the first ILD layer therebetween. The capacitor can also include a third capacitor having a pair of the second contacts and part of the second ILD layer therebetween.

As illustrated in FIG. 8F, contacts 818 are formed extending vertically through ILD layer 812 and thinned silicon substrate 802 to be in contact with contacts 806. To form contacts 818, contact openings, such as trenches, are first patterned using lithography processes based on the locations of contacts 806, such that each contact 806 is aligned with a respective contact opening, according to some embodiments. The patterned contact openings then can be etched through ILD layer 812 and thinned silicon substrate 802 using dry etching and/or wet etching, such as RIE, stopped at contacts 806, according to some embodiments. Conductive materials then can be deposited using one or more thin film deposition processes including, but not limited to, CVD, PVD, ALD, or any combination thereof on ILD layer 812 and into the contact openings to form an adhesive layer/barrier layer and a contact core of each contact 818. In some embodiments, dielectric materials are deposited into the contact openings first to form spacers. In some embodiments, a planarization process, such as etching and/or CMP, is performed to remove the excess conductive materials and planarize the top surface of ILD layer 812 and contacts 818. In some embodiments, pad contacts (e.g., contact 144 in FIG. 1) through ILD layer 812 and thinned silicon substrate 802 are formed in the same process for forming contacts 818, such that the formation of contacts 818 does not introduce extra processes into the fabrication flow. Contact pads (e.g., contact pad 140 in FIG. 1) then can be formed above and in contact with the pad contacts.

Figure 11:
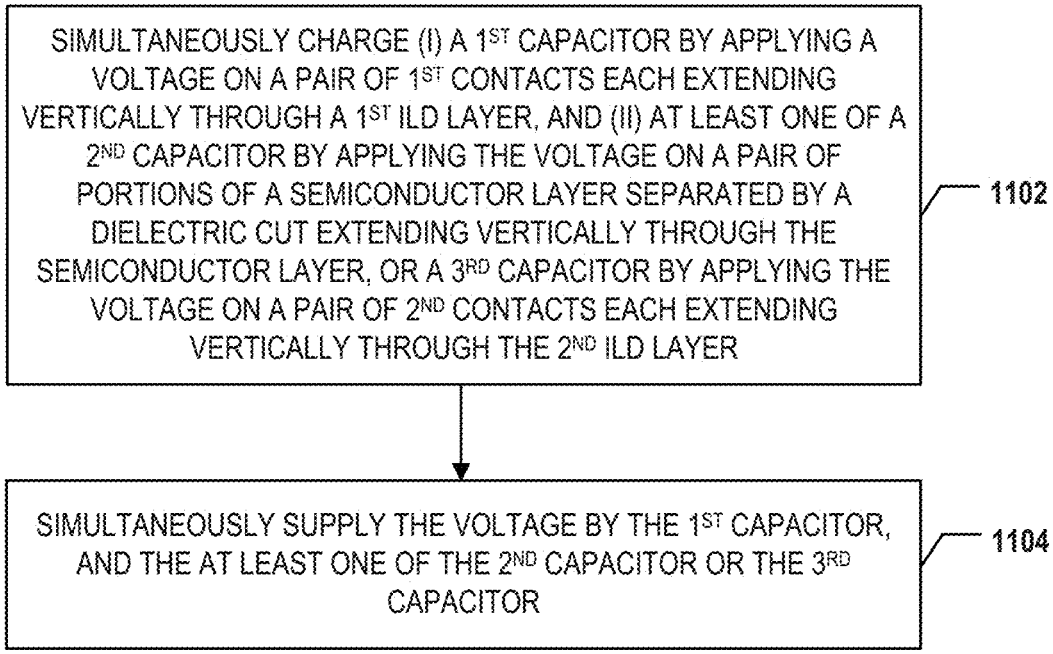
FIG. 11 illustrates a flowchart of a method for operating an exemplary 3D semiconductor device having on-chip capacitors, according to some embodiments of the present disclosure.

FIG. 11 illustrates a flowchart of a method 1100 for operating an exemplary 3D semiconductor device having on-chip capacitors, according to some embodiments of the present disclosure. Examples of the 3D semiconductor device depicted in FIG. 11 include 3D semiconductor devices 400, 500, 600, and 700 depicted in FIGS. 4A, 4B, 5A, 5B, 6A, 6B, 7A, and 7B. FIG. 11 will be described with reference to FIG. 3. It is understood that the operations shown in method 1100 are not exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which a first capacitor and at least one of second and third capacitors in a 3D semiconductor device are simultaneously charging. In some embodiments, the first capacitor and the at least one of the second and third capacitors are in parallel. The 3D semiconductor device can include a stack of a first ILD layer, a semiconductor layer, and a second ILD layer, for example, first ILD layer 302, semiconductor layer 304, and second ILD layer 306 in FIG. 3. As illustrated in FIG. 3, a pair of first contacts each extending vertically through first ILD layer 302 and par of first ILD layer 302 therebetween can be configured to form the first capacitor $C_1$, which can be charged by applying a voltage on the pair of first contacts. A pair of portions of semiconductor layer 304 separated by a dielectric cut extending vertically through semiconductor layer 304 and the dielectric cut therebetween can be configured to form the second capacitor $C_2$, which can be charged by applying the voltage on the pair of the portions of semiconductor layer 304. A pair of second contacts each extending vertically through second ILD layer 306 and par of second ILD layer 306 therebetween can be configured to form the third capacitor $C_3$, which can be charged by applying the voltage on the pair of second contacts.

Method 1100 proceeds to operation 1104, as illustration FIG. 11, in which the voltage is simultaneously supplied by the first capacitor and the at least one of the second and third capacitors. As illustrated in FIG. 3, electric charge can be stored in the first capacitor $C_1$ and at least one of the second and third capacitors $C_2$ and $C_3$. The first capacitor $C_1$ and at least one of the second and third capacitors $C_2$ and $C_3$ can work as a battery to simultaneously supply the voltage that charged the capacitors to release the stored electric charge as needed.

According to one aspect of the present disclosure, a method for forming a semiconductor device is disclosed. A first ILD layer is formed on a first side of a substrate. A plurality of first contacts each extending vertically through the first ILD layer and in contact with the substrate are formed. The substrate is thinned from a second side opposite to the first side of the substrate. A plurality of dielectric cuts each extending vertically through the thinned substrate are formed to separate the thinned substrate into a plurality of semiconductor blocks, such that the plurality of semiconductor blocks are in contact with the plurality of first contacts, respectively.

In some embodiments, the plurality of first contacts include a plurality of parallel wall-shaped contacts.

In some embodiments, the plurality of dielectric cuts include a plurality of parallel wall-shaped dielectric cuts each extending vertically through the semiconductor layer and extending laterally to form laterally interleaved the dielectric cuts and the semiconductor blocks.

In some embodiments, the plurality of dielectric cuts include a plurality of parallel wall-shaped dielectric cuts each extending vertically through the thinned substrate and extending laterally to form laterally interleaved the dielectric cuts and the semiconductor blocks.

In some embodiments, prior to thinning the substrate, a memory stack is formed on the first side of the substrate, and a plurality of channel structures each extending vertically through the memory stack and in contact with the substrate are formed. In some embodiments, the plurality of first contacts are formed in a peripheral region outside of the memory stack.

In some embodiments, a thickness of the first ILD layer is equal to or greater than a thickness of the memory stack.

In some embodiments, a plurality of word line contacts in contact with the memory stack are formed in a same process for forming the plurality of first contacts.

In some embodiments, a second ILD layer is formed on the second side of the thinned substrate, and a plurality of second contacts each extending vertically through the second ILD layer are formed, such that each of the plurality of semiconductor blocks is in contact with one or more of the second contacts.

In some embodiments, the plurality of second contacts include a plurality of VIA contacts.

In some embodiments, a source contact extending vertically through the second ILD layer and in contact with the thinned substrate is formed in a same process for forming the plurality of second contacts.

In some embodiments a second ILD layer is formed on the second side of the thinned substrate, and a plurality of third contacts each extending vertically through the second ILD layer and the thinned substrate are formed, such that each of the plurality of first contacts is in contact with one or more of the third contacts.

In some embodiments, the plurality of third contacts include a plurality of VIA contacts.

In some embodiments, a pad contact extending vertically through the second ILD layer and the thinned substrate is formed in a same process for forming the plurality of third contacts, and a contact pad above and in contact with the pad contact is formed.

According to another aspect of the present disclosure, a method for forming a semiconductor device is disclosed. A first ILD layer is formed on a first side of a substrate. A plurality of first contacts each extending vertically through the first ILD layer and in contact with the substrate are formed. The substrate is thinned from a second side opposite to the first side of the substrate. A second ILD layer is formed on the second side of the thinned substrate. A plurality of second contacts each extending vertically through the second ILD layer and the thinned substrate and in contact with the plurality of first contacts, respectively, are formed.

In some embodiments, the plurality of first contacts include a plurality of parallel wall-shaped contacts, and the plurality of second contacts include a plurality of parallel wall-shaped contacts.

In some embodiments, prior to thinning the substrate, a memory stack is formed on the first side of the substrate, and a plurality of channel structures each extending vertically through the memory stack and in contact with the substrate are formed. The plurality of first contacts are formed in a peripheral region outside of the memory stack.

In some embodiments, a thickness of the first ILD layer is equal to or greater than a thickness of the memory stack.

In some embodiments, a plurality of word line contacts in contact with the memory stack are formed in a same process for forming the plurality of first contacts.

In some embodiments, a pad contact extending vertically through the second ILD layer and the thinned substrate is formed in a same process for forming the plurality of third contacts, and a contact pad above and in contact with the pad contact is formed.

According to still another aspect of the present disclosure, a method for operating a 3D semiconductor device including a stack of a first ILD layer, a semiconductor layer, and a second ILD layer, and a capacitor structure is disclosed. A first capacitor and at least one of a second capacitor or a third capacitor are simultaneously charged. The first capacitor is charged by applying a voltage on a pair of first contacts each extending vertically through the first ILD layer. The second capacitor is charged by applying the voltage on a pair of portions of the semiconductor layer separated by a dielectric cut extending vertically through the semiconductor layer. A third capacitor is charged by applying the voltage on a pair of second contacts each extending vertically through the second ILD layer.

In some embodiments, the first capacitor and the at least one of the second capacitor or the third capacitor are in parallel.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a memory device, comprising:
   forming a first interlayer dielectric (ILD) layer on a first side of a substrate;
   forming a plurality of first contacts each extending vertically through the first ILD layer and in contact with the substrate;
   thinning the substrate from a second side opposite to the first side of the substrate;
   forming a plurality of dielectric cuts each extending vertically through the thinned substrate to separate the thinned substrate into a plurality of semiconductor blocks, such that the plurality of semiconductor blocks are in contact with the plurality of first contacts, respectively;
   forming a second ILD layer on the second side of the thinned substrate; and
   forming a plurality of second contacts each extending vertically through the entire second ILD layer.

2. The method of claim 1, wherein the plurality of first contacts comprise a plurality of parallel wall-shaped contacts.

3. The method of claim 1, wherein the plurality of dielectric cuts comprise a plurality of parallel wall-shaped dielectric cuts each extending vertically through the thinned substrate and extending laterally to separate the thinned substrate, such that the dielectric cuts and the semiconductor blocks are laterally interleaved.

4. The method of claim 1, further comprising, prior to thinning the substrate, forming a memory stack on the first side of the substrate, and a plurality of channel structures each extending vertically through the memory stack and in contact with the substrate,
   wherein the plurality of first contacts are formed in a peripheral region outside of the memory stack.

5. The method of claim 4, wherein a thickness of the first ILD layer is equal to or greater than a thickness of the memory stack.

6. The method of claim 4, further comprising forming a plurality of word line contacts in contact with the memory stack in a same process for forming the plurality of first contacts.

7. The method of claim 1,
   wherein each of the plurality of semiconductor blocks is in contact with one or more of the second contacts.

8. The method of claim 7, wherein the plurality of second contacts comprise a plurality of vertical interconnect access (VIA) contacts.

9. The method of claim 7, further comprising forming a source contact extending vertically through the second ILD layer and in contact with the thinned substrate in a same process for forming the plurality of second contacts.

10. The method of claim 1,
    wherein the plurality of second contacts each further extends vertically through the thinned substrate, such that each of the plurality of first contacts is in contact with one or more of the second contacts.

11. The method of claim 10, wherein the plurality of second contacts comprise a plurality of VIA contacts.

12. The method of claim 10, further comprising:
    forming a pad contact extending vertically through the second ILD layer and the thinned substrate in a same process for forming the plurality of second contacts; and
    forming a contact pad above and in contact with the pad contact.

13. A method for forming a memory device, comprising:
    forming a first interlayer dielectric (ILD) layer and a memory stack on a first side of a substrate;
    forming a plurality of channel structures each extending vertically through the memory stack and in contact with the substrate
    forming a plurality of first contacts in a peripheral region outside of the memory stack, each first contact extending vertically through the first ILD layer and in contact with the substrate;
    thinning the substrate from a second side opposite to the first side of the substrate;
    forming a plurality of dielectric cuts each extending vertically through the thinned substrate to separate the thinned substrate into a plurality of semiconductor blocks, such that the plurality of semiconductor blocks are in contact with the plurality of first contacts, respectively, forming a second ILD layer on the second side of the thinned substrate; and forming a plurality of second contacts each extending vertically through the entire second ILD layer.

14. The method of claim 13, wherein the plurality of first contacts comprise a plurality of parallel wall-shaped contacts.

15. The method of claim 13, wherein the plurality of dielectric cuts comprise a plurality of parallel wall-shaped dielectric cuts each extending vertically through the thinned substrate and extending laterally to separate the thinned substrate, such that the dielectric cuts and the semiconductor blocks are laterally interleaved.

16. The method of claim 13, further comprising forming a plurality of word line contacts in contact with the memory stack in a same process for forming the plurality of first contacts.

17. The method of claim 13,
wherein each of the plurality of semiconductor blocks is in contact with one or more of the second contacts.

18. The method of claim 17, further comprising forming a source contact extending vertically through the second ILD layer and in contact with the thinned substrate in a same process for forming the plurality of second contacts.

19. The method of claim 13,
wherein the plurality of second contacts each vertically through the thinned substrate, such that each of the plurality of first contacts is in contact with one or more of the second contacts.

20. The method of claim 19, further comprising:
forming a pad contact extending vertically through the second ILD layer and the thinned substrate in a same process for forming the plurality of second contacts; and forming a contact pad above and in contact with the pad contact.

* * * * *